(12) United States Patent
Morita et al.

(10) Patent No.: US 12,004,293 B2
(45) Date of Patent: Jun. 4, 2024

(54) SUBSTRATE FOR MOUNTING ELECTRONIC ELEMENT, ELECTRONIC DEVICE, AND ELECTRONIC MODULE

(71) Applicant: KYOCERA Corporation, Kyoto (JP)

(72) Inventors: Yukio Morita, Kyoto (JP); Noboru Kitazumi, Kyoto (JP); Yousuke Moriyama, Kyoto (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 18/186,548

(22) Filed: Mar. 20, 2023

(65) Prior Publication Data

US 2023/0328885 A1    Oct. 12, 2023

Related U.S. Application Data

(63) Continuation of application No. 16/965,855, filed as application No. PCT/JP2019/003113 on Jan. 30, 2019, now Pat. No. 11,612,056.

(30) Foreign Application Priority Data

Jan. 30, 2018  (JP) .................................. 2018-013760
Apr. 25, 2018  (JP) .................................. 2018-084163

(51) Int. Cl.
*H05K 1/03*   (2006.01)
*H01L 23/12*  (2006.01)
(Continued)

(52) U.S. Cl.
CPC ............. *H05K 1/036* (2013.01); *H01L 23/12* (2013.01); *H01L 23/373* (2013.01);
(Continued)

(58) Field of Classification Search
CPC ...... H05K 1/036; H05K 1/0203; H05K 1/021; H05K 1/03; H05K 2201/0323; H05K 2201/10416; H01L 23/12
See application file for complete search history.

(56) References Cited

U.S. PATENT DOCUMENTS 4,711,804 A    12/1987  Burgess
5,296,310 A *   3/1994  Kibler ................. H01L 23/3735
                                                    428/614
(Continued)

FOREIGN PATENT DOCUMENTS

JP    2009-094213 A    4/2009
JP    2011-023670 A    2/2011
(Continued)

OTHER PUBLICATIONS

English Translation JP2017130494 (Year: 2017).*

*Primary Examiner* — Steven T Sawyer
(74) *Attorney, Agent, or Firm* — Volpe Koenig

(57) ABSTRACT

A first substrate includes a first surface and a second surface opposite to the first surface. A second substrate includes a third surface and a fourth surface opposite to the third surface. A third substrate includes a fifth surface and a sixth surface opposite to the fifth surface. The first substrate is made of an insulator, and includes a mounting portion for mounting an electronic element at the first surface, and the mounting portion is a rectangular shape. The third substrate is made of a carbon material, and the fifth surface is connected to at least the second surface at location overlapped with the mounting portion in plan view. The third substrate has a larger heat conduction in a direction perpendicular to the longitudinal direction of the mounting portion than heat conduction in the longitudinal direction of the mounting portion in plan view.

4 Claims, 18 Drawing Sheets

(51) Int. Cl.
  *H01L 23/373*   (2006.01)
  *H05K 1/02*   (2006.01)

(52) U.S. Cl.
  CPC ........... *H05K 1/0203* (2013.01); *H05K 1/021* (2013.01); *H05K 1/03* (2013.01); *H05K 2201/0323* (2013.01); *H05K 2201/10416* (2013.01)

(56) References Cited

U.S. PATENT DOCUMENTS

| | | | |
|---|---|---|---|
| 5,944,094 A | 8/1999 | Gungor | |
| 6,222,740 B1 | 4/2001 | Bovensiepen et al. | |
| 9,380,733 B2 | 6/2016 | Nagata et al. | |
| 2010/0007013 A1 | 1/2010 | Kuroda et al. | |
| 2010/0044741 A1 | 2/2010 | Okimura | |
| 2011/0014417 A1* | 1/2011 | Lemak | H01L 23/4006 427/407.1 |
| 2011/0303399 A1* | 12/2011 | Sakimichi | H01L 23/36 165/185 |
| 2012/0152510 A1* | 6/2012 | Noda | B23K 1/0016 228/208 |
| 2018/0352646 A1 | 12/2018 | Yu et al. | |

FOREIGN PATENT DOCUMENTS

| | | |
|---|---|---|
| JP | 2012-142547 A | 7/2012 |
| JP | 2012-238733 A | 12/2012 |
| JP | 2013-175508 A | 9/2013 |
| JP | 2015-191950 A | 11/2015 |
| JP | 2017-130494 A | 7/2017 |

* cited by examiner

SUBSTRATE FOR MOUNTING ELECTRONIC ELEMENT, ELECTRONIC DEVICE, AND ELECTRONIC MODULE

CROSS REFERENCE TO RELATED APPLICATION

This application is a continuation application of U.S. patent application Ser. No. 16/965,855 filed on Jul. 29, 2020, which is a National Phase entry based on PCT Application No. PCT/JP2019/003113, filed on Jan. 30, 2019, which claims the benefit of Japanese Patent Application No. 2018-013760, filed on Jan. 30, 2018 and Japanese Patent Application No. 2018-084163, filed on Apr. 25, 2018. The contents of which are incorporated by reference herein in their entirety.

TECHNICAL FIELD

The present invention relates to a substrate for mounting an electronic element, an electronic device, and an electronic module.

BACKGROUND ART

In the related art, a substrate for mounting an electronic element includes an insulating substrate having a first surface, a second surface, and side surfaces, and an electronic element mounting portion and a wiring layer on the first surface of the insulating substrate. In the substrate for mounting the electronic element, after an electronic element is mounted on the electronic element mounting portion, the substrate for mounting the electronic element with the electronic element is mounted on a package for housing an electronic element to form an electronic device (refer to Japanese Unexamined Patent Application Publication No. 2013-175508).

SUMMARY OF INVENTION

Technical Problem

A substrate for mounting an electronic element according to the present disclosure includes a first substrate that includes a first surface and a second surface opposite to the first surface. A second substrate includes a third surface and a fourth surface opposite to the third surface. A third substrate includes a fifth surface and a sixth surface opposite to the fifth surface. The first substrate is made of an insulator, and comprising a mounting portion for mounting an electronic element at the first surface, and the mounting portion for mounting the electronic element is a rectangular shape. The third substrate is made of a carbon material, and the fifth surface is connected to at least the second surface at location overlapped with the mounting portion for mounting the electronic element in plan view. The third substrate has a larger heat conduction in a direction perpendicular to the longitudinal direction of the mounting portion than heat conduction in the longitudinal direction of the mounting portion in plan view.

An electronic device according to the present disclosure includes the substrate for mounting the electronic element having the above-described configuration, an electronic element mounted on the mounting portion of the substrate for mounting the electronic element, and a wiring substrate or a package for housing an electronic element on which the substrate for mounting the electronic element is mounted.

An electronic module according to the present disclosure includes the electronic device having the above-described configuration, and a module substrate to which the electronic device is connected.

DESCRIPTION OF EMBODIMENTS

Figure 1A:
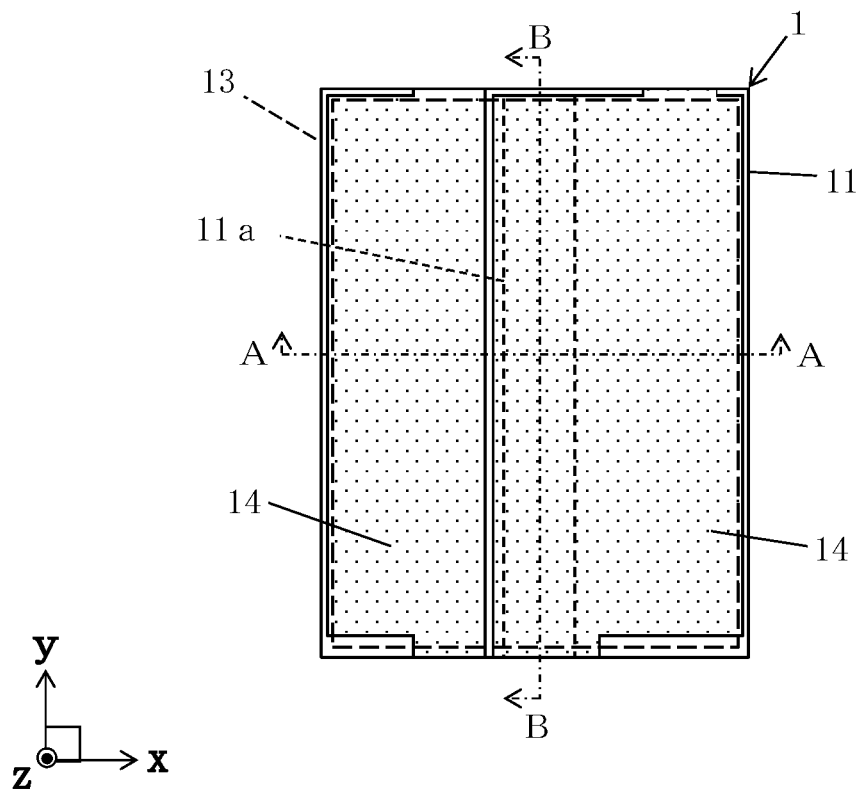
FIG. 1A is a top view illustrating a substrate for mounting an electronic element according to a first embodiment.
Figure 1B:
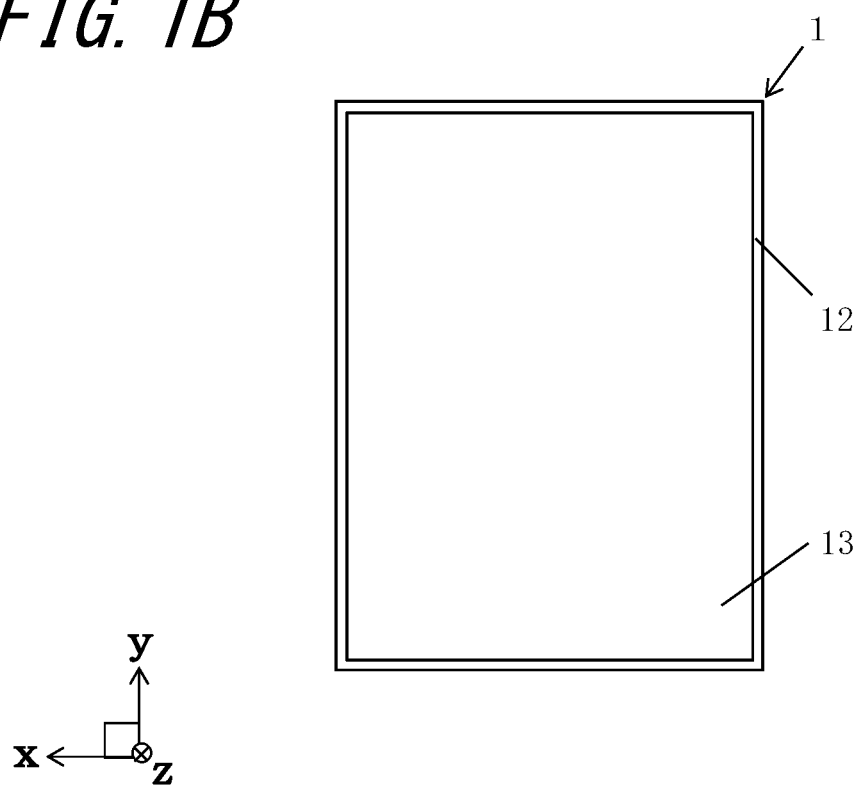
FIG. 1B is a bottom view of FIG. 1A.

Some exemplary embodiments of the present disclosure will be described with reference to the accompanying drawings.

(First embodiment) The substrate for mounting the electronic element 1 according to a first embodiment includes a first substrate 11, a second substrate 12, and a third substrate 13, as in an example illustrated in FIGS. 1A to 4B. An electronic device includes a substrate for mounting an electronic element 1, an electronic element 2 mounted on a mounting portion 11a of the substrate for mounting the electronic element 1, and a wiring substrate 4 on which the substrate for mounting the electronic element 1 is mounted, as in the examples illustrated in FIGS. 5A to 6B. For example, the electronic device is connected to a connection pad 61 on a module substrate 6 constituting an electronic module by using a bonding material, as in the example illustrated in FIG. 7.

The substrate for mounting the electronic element 1 according to the present embodiment includes a first substrate 11 having a first surface and a second surface opposite to the first surface; a second substrate 12 having a third surface and a fourth surface opposite to the third surface; and a third substrate 13 having a fifth surface and a sixth surface opposite to the fifth surface. The first substrate 11 is made of an insulator, and having a mounting portion 11a for mounting an electronic element 2 at the first surface 11, and the mounting portion 11a for mounting the electronic element 2 is a rectangular shape. The third substrate 13 is made of a carbon material, and the fifth surface is connected to at least the second surface at location overlapped with the mounting portion 11a for mounting the electronic element 2 in plan view. The third substrate 13 has a larger heat conduction in a direction perpendicular to the longitudinal direction of the mounting portion 11a than heat conduction in the longitudinal direction of the mounting portion in plan view. In FIGS. 1A to 4B, the electronic element 2 is mounted on an xy plane in a virtual xyz space. In FIGS. 1A to 4B, an upward direction refers to a positive direction of a virtual z-axis. The distinction between the upper and lower sides in the following description is for convenience, and does not limit the upper and lower sides if the substrate for mounting the electronic element 1 or the like is actually used.

In the example illustrated in FIG. 1A, an outer edge of the third substrate 13 is illustrated by a broken line in plan view. A metal layer 14 is illustrated by hatching in the example illustrated in FIG. 1A.

The first substrate 11 has a first surface (upper surface in FIGS. 1A to 3B) and a second surface (lower surface in FIGS. 1A to 3B). The first surface and the second surface are located on sides opposite to each other in the thickness direction of the first substrate 11. The first substrate 11 is made of a single insulating layer or a plurality of insulating layers, and has a square plate-like shape having two sets of facing sides (four sides) with respect to each of the first surface and the second surface in plan view. The first substrate 11 functions as a support body for supporting the electronic element 2 in a rectangular shape, and the electronic element 2 is bonded to and fixed on the rectangular mounting portion 11a located on the first surface of the first substrate 11 through a bonding member such as Au—Sn. One end portion of the mounting portion 11a in a longitudinal direction is located at an outer edge portion of the first surface.

The second substrate 12 has a third surface (upper surface in FIGS. 1A to 3B) and a fourth surface (lower surface in FIGS. 1A to 3B). The third surface and the fourth surface are located on sides opposite to each other in the thickness direction of the second substrate 12. The second substrate 12 is made of a single insulating layer or a plurality of insulating layers, and has a frame shape having two sets of facing sides (four sides) with respect to each of the third surface and the fourth surface in plan view. The second substrate 12 located on the second surface opposite to the first surface and having the third surface facing the second surface and the fourth surface opposite to the third surface.

The first substrate 11 is made of an insulator, and the second substrate 12 is made of an insulator or a metal.

For the second substrate 12 of metal, for example, a metal material such as copper (Cu), copper-tungsten (Cu—W), or copper-molybdenum (Cu—Mo) can be used. The second substrate 12 has a through-hole 12a extending from the third surface to the fourth surface. The through-hole 12a is a region where the third substrate 13 is embedded.

For example, as the first substrate 11 and the second substrate 12 of an insulator, ceramics such as an aluminum oxide sintered body (alumina ceramics), an aluminum nitride sintered body, a mullite sintered body, or a glass ceramic sintered body can be used. If the first substrate 11 and the second substrate 12 are, for example, aluminum nitride sintered bodies, an appropriate organic binder, a solvent and the like are added to and mixed with raw material powders such as aluminum nitride (AlN), erbium oxide ($Er_2O_3$), and yttrium oxide ($Y_2O_3$) to prepare a slurry. The slurry is formed into a sheet by employing a known doctor blade method or a calendar roll method in the related art to prepare a ceramic green sheet. If necessary, a plurality of ceramic green sheets is laminated, and the ceramic green sheets are fired at a high temperature (approximately 1,800° C.) to manufacture the first substrate 11 and the second substrate 12 each made of the single insulating layer or the plurality of insulating layers.

The third substrate 13 has a fifth surface (upper surface in FIGS. 1A to 3B) and a sixth surface (lower surface in FIGS. 1A to 3B). The fifth surface and the sixth surface are located on sides opposite to each other in the thickness direction of the third substrate 13.

The third substrate 13 is made of, for example, a carbon material, and is formed as a structure in which graphene in which six-membered rings are connected by covalent bonds is laminated. Each surface is a material bonded by van der Waals force.

The third substrate 13 is embedded in the through-hole 12a of the second substrate 12, as in the example illustrated in FIGS. 1A to 3B. The fifth surface of the third substrate 13 is located adjacent to the third surface of the second substrate 12, and the sixth surface of the third substrate 13 is located adjacent to the fourth surface of the second substrate 12.

As the first substrate 11, an aluminum nitride sintered body having a good thermal conductivity may be used. For the second substrate 12 of an insulator, an aluminum nitride sintered body having a good thermal conductivity may be used. The inner surface of the through-hole 12a of the second substrate 12 and the outer surface of the third substrate 13 are bonded, for example, by a bonding material made of an active brazing material such as a TiCuAg alloy or a TiSnAgCu alloy, and thus the second substrate 12 and the third substrate 13 are bonded to each other. The bonding material is disposed between the second substrate 12 and the third substrate 13 at a thickness of approximately 10 µm.

In the first substrate 11 and the second substrate 12, the second surface of the first substrate 11 and the third surface of the second substrate 12 are bonded to each other, and in the first substrate 11 and the third substrate 13, the second surface of the first substrate 11 and the fifth surface of the third substrate 13 are bonded to each other, for example, by a bonding material made of an active brazing material such as a TiCuAg alloy or a TiSnAgCu. The bonding material is disposed between the first substrate 11 and the second substrate 12 and between the first substrate 11 and the third substrate 13 at a thickness of approximately 10 µm.

The first substrate 11 has a square shape in plan view. The second substrate 12 has a square frame shape in plan view. The third substrate 13 has a square shape in plan view. By bonding the first substrate 11 and the second substrate 12, bonding the first substrate 11 and the third substrate 13, and bonding the second substrate 12 and the third substrate 13, a square composite substrate in plan view is formed. The square shape is a quadrangle shape such as a square shape or a rectangular shape. In the example illustrated in FIGS. 1A to 3B, the first substrate 11 has a rectangular shape, and a rectangular composite substrate in plan view is formed.

The substrate thickness T1 of the first substrate 11 is, for example, approximately 50 µm to 500 µm, and the substrate thickness T2 of the second substrate 12 is, for example, approximately 100 µm to 2,000 µm. The substrate thickness T3 of the third substrate 13 is, for example, approximately 100 µm to 2,000 µm. The thickness T2 of the second substrate 12 and the thickness T3 of the third substrate 13 are the same in size, and are located at a similar thickness within a range of approximately 5% ($0.95 \leq T2 \leq T3 \leq 1.05 T2$). If the first substrate 11 and the second substrate 12 satisfy $T2>T1$, and the first substrate 11 and the third substrate 13 satisfy $T3>T1$, heat of the first substrate 11 can be appropriately dissipated to the third substrate 13.

Figure 2:
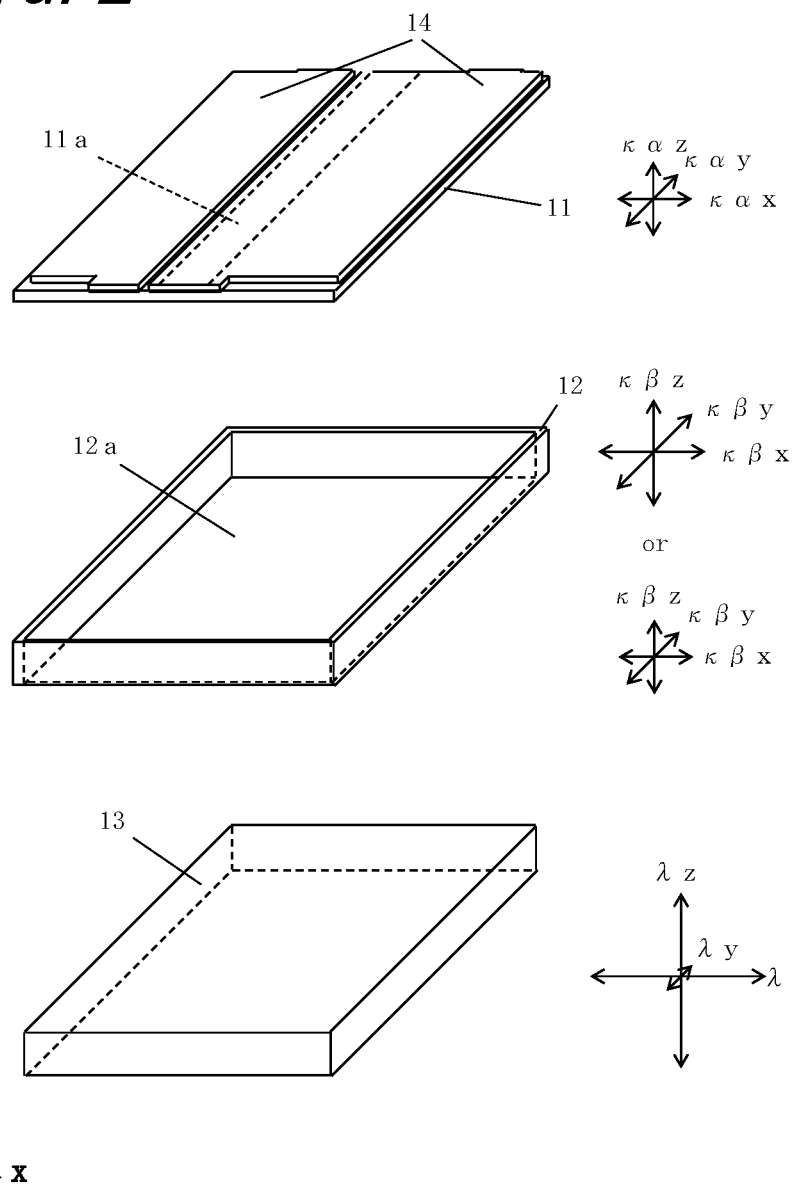
FIG. 2 is an exploded perspective view of a first substrate, a second substrate, and a third substrate of the substrate for mounting the electronic element illustrated in FIGS. 1A and 1B.
Figure 3A:
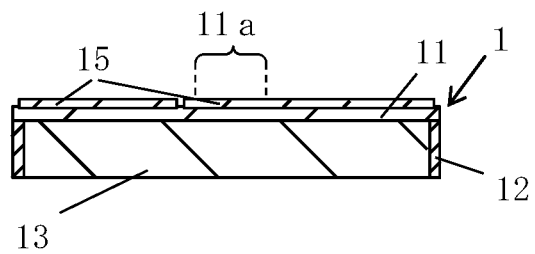
FIG. 3A is a longitudinal sectional view taken along the line A-A of the substrate for mounting the electronic element illustrated in FIG. 1A.
Figure 3A:
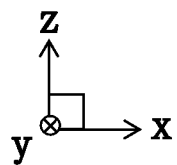
Figure 3B:
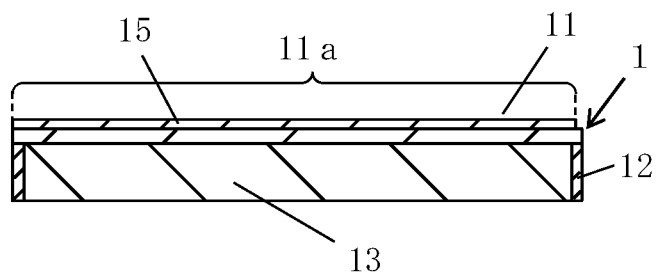
FIG. 3B is a longitudinal sectional view taken along the line B-B of the substrate for mounting the electronic element illustrated in FIG. 1A.
Figure 3B:
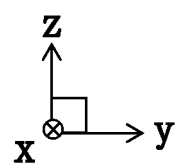

As in the example illustrated in FIG. 2, the thermal conductivity $\kappa\alpha$ of the first substrate 11 is substantially constant in the x direction and the y direction in the plane direction, and the thermal conductivity $\kappa\alpha$ of the first substrate 11 in the z direction that is the thickness direction of the first substrate 11 is also equivalent to that in the x direction and the y direction in the plane direction ($\kappa\alpha x \approx \kappa\alpha y \approx \kappa\alpha z$). For example, if an aluminum nitride sintered body is used as the first substrate 11, a substrate having a thermal conductivity $\kappa\alpha$ of approximately 100 to 200 W/m·K is used as the first substrate 11.

As in the example illustrated in FIG. 2, the thermal conductivity $\kappa\beta$ of the second substrate 12 is substantially constant in the x direction and the y direction in the plane direction, and the thermal conductivity $\kappa\beta$ of the second substrate 12 in the z direction that is the thickness direction of the first substrate 11 is also equivalent to that in the x direction and the y direction in the plane direction ($\kappa\beta x \approx \kappa\beta y \approx \kappa\beta z$). For example, if copper is used as the second substrate 12, a substrate having a thermal conductivity $\kappa\beta$ of approximately 400 W/m·K is used as the second substrate 11. If an aluminum nitride sintered body is used as the second substrate 12, a substrate having a thermal conductivity $\kappa\beta$ of approximately 100 to 200 W/m·K is used as the second substrate 12.

The thermal conductivity $\lambda$ of the third substrate 13 differs in magnitude between the x direction and the y direction in the plane direction. The relationship between the thermal conductivity $\lambda x$, $\lambda y$, and $\lambda z$ in the respective directions of the third substrate 13 illustrated in FIG. 2 is "thermal conductivity $\lambda x \approx$ thermal conductivity $\lambda z >>$ thermal conductivity $\lambda y$". The thermal conductivity $\lambda$ of the third substrate 13 in the x direction in the plane direction is equivalent to that in the z direction in the thickness direction, and is different to that in the y direction in the plane direction. For example, the thermal conductivity $\lambda x$ and the thermal conductivity $\lambda z$ of the third substrate 13 are approximately 1000 W/m·K, and the thermal conductivity $\lambda y$ of the third substrate 13 is approximately 4 W/m·K.

A metal layer 15 is located on the first surface of the first substrate 11. The metal layer 15 is used as the mounting portion 11a for mounting the electronic element 2 or a connection portion for connecting to the connection member 3 such as a bonding wire, and is a layer for electrically connecting the electronic element 2 to a wiring conductor of the wiring substrate 4.

The metal layer 15 includes a thin film layer and a plating layer. The thin film layer has, for example, an adhesion metal layer and a barrier layer. The adhesion metal layer constituting the thin film layer is formed on the first surface of the first substrate 11. The adhesion metal layer is made of, for example, tantalum nitride, nickel-chromium, nickel-chromium-silicon, tungsten-silicon, molybdenum-silicon, tungsten, molybdenum, titanium, chromium, or the like, and is deposited on the first surface of the first substrate 11 by adopting a thin film forming technique such as a evaporation method, an ion plating method, or a sputtering method. For example, if the adhesion metal layer is formed by using a vacuum evaporation method, the first substrate 11 is installed in a film forming chamber of a vacuum evaporation apparatus, and a metal piece to be an adhesion metal layer is disposed in an evaporation source in the film forming chamber. Thereafter, the film forming chamber is in a vacuum state (pressure of $10^{-2}$ Pa or less), and the metal piece disposed in the evaporation source is heated and vapor-deposited, and molecules of the vapor-deposited metal piece are deposited on the first substrate 11. Therefore, a thin film metal layer to be an adhesion metal layer is formed. After a resist pattern is formed on the first substrate 11 on which the thin film metal layer is formed by using a photolithography method, an excessive thin film metal layer is removed by etching, and thus an adhesion metal layer is formed. A barrier layer is deposited on the upper surface of the adhesion metal layer. The barrier layer has good adhesion and wettability with the adhesion metal layer and the plating layer, and functions to firmly bond the adhesion metal layer and the plating layer and to prevent mutual diffusion between the adhesion metal layer and the plating layer. The barrier layer is made of, for example, nickel-chromium, platinum, palladium, nickel, cobalt, or the like, and is deposited on the surface of the adhesion metal layer by a thin film forming technique such as a evaporation method, an ion plating method, or a sputtering method.

The thickness of the adhesion metal layer is preferably approximately 0.01 to 0.5 µm. If the thickness is less than 0.01 µm, it tends to be difficult to firmly adhere the adhesion metal layer on the first substrate 11. If the thickness exceeds 0.5 µm, separating of the adhesion metal layer is likely to occur due to internal stress during film formation of the adhesion metal layer. The thickness of the barrier layer is preferably approximately 0.05 to 1 μm. If the thickness is less than 0.05 μm, defects such as pinholes occur, and the barrier layer tends to be difficult to perform the function as a barrier layer. If the thickness exceeds 1 μm, the barrier layer is likely to be separated due to internal stress during film formation.

The plating layer is deposited on the exposed surface of the thin film layer by an electrolytic plating method or electroless plating method. The plating layer is made of a metal having good corrosion resistance such as nickel, copper, gold, or silver, and having connectivity with a connection member. For example, a nickel plating layer having a thickness of approximately 0.5 to 5 μm and a gold plating layer having a thickness of approximately 0.1 to 3 μm are sequentially deposited. As a result, corrosion of the metal layer 15 can be effectively suppressed, and the bonding between the metal layer 15 and the wiring conductor on the wiring substrate 4 can be strengthened.

A metal layer such as a copper (Cu) or gold (Au) layer may be disposed on the barrier layer so that the plating layer is appropriately formed. Such a metal layer is formed by a method similar to the method by which the thin film layer is formed.

Figure 4A:
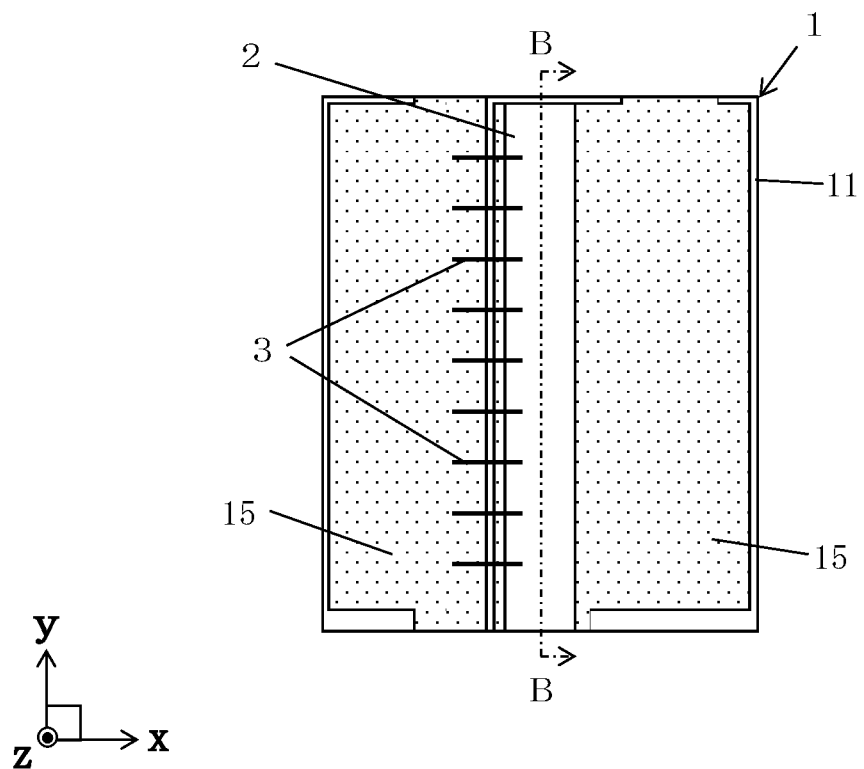
FIG. 4A is a top view illustrating a state where an electronic element is mounted on the substrate for mounting the electronic element illustrated in FIG. 1A.
Figure 4B:
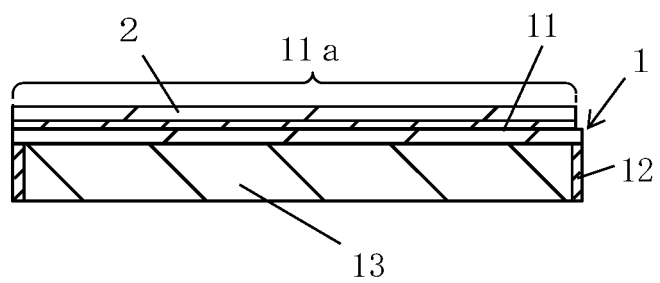
FIG. 4B is a longitudinal sectional view taken along the line B-B in FIG. 4A.
Figure 4B:
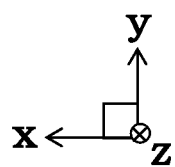
Figure 5A:
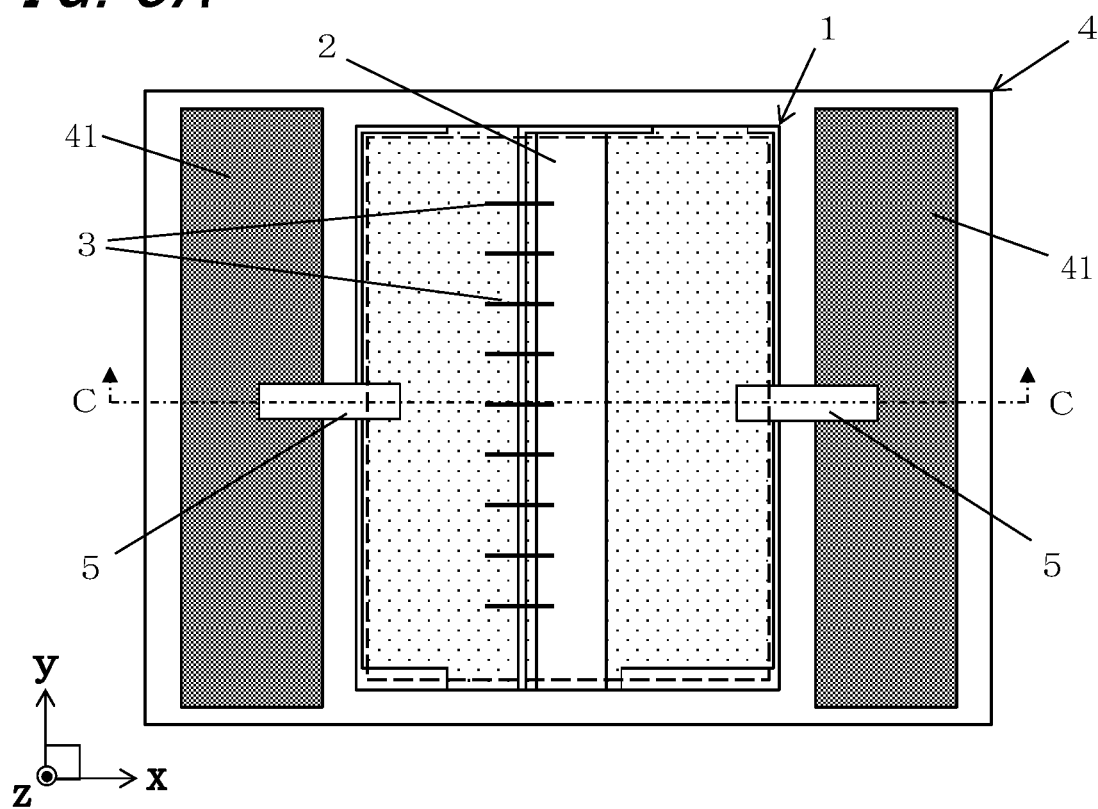
FIG. 5A is a top view illustrating an example of an electronic device using the substrate for mounting the electronic element illustrated in FIGS. 1A and 1B.
Figure 5B:
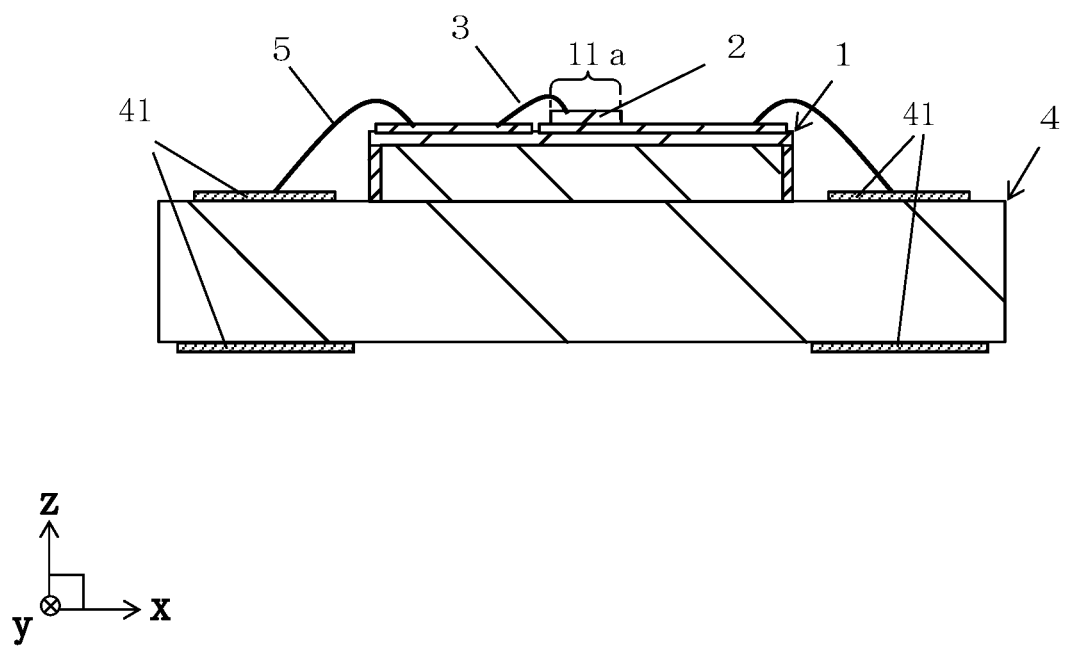
FIG. 5B is a longitudinal sectional view taken along the line C-C in FIG. 5A.
Figure 6A:
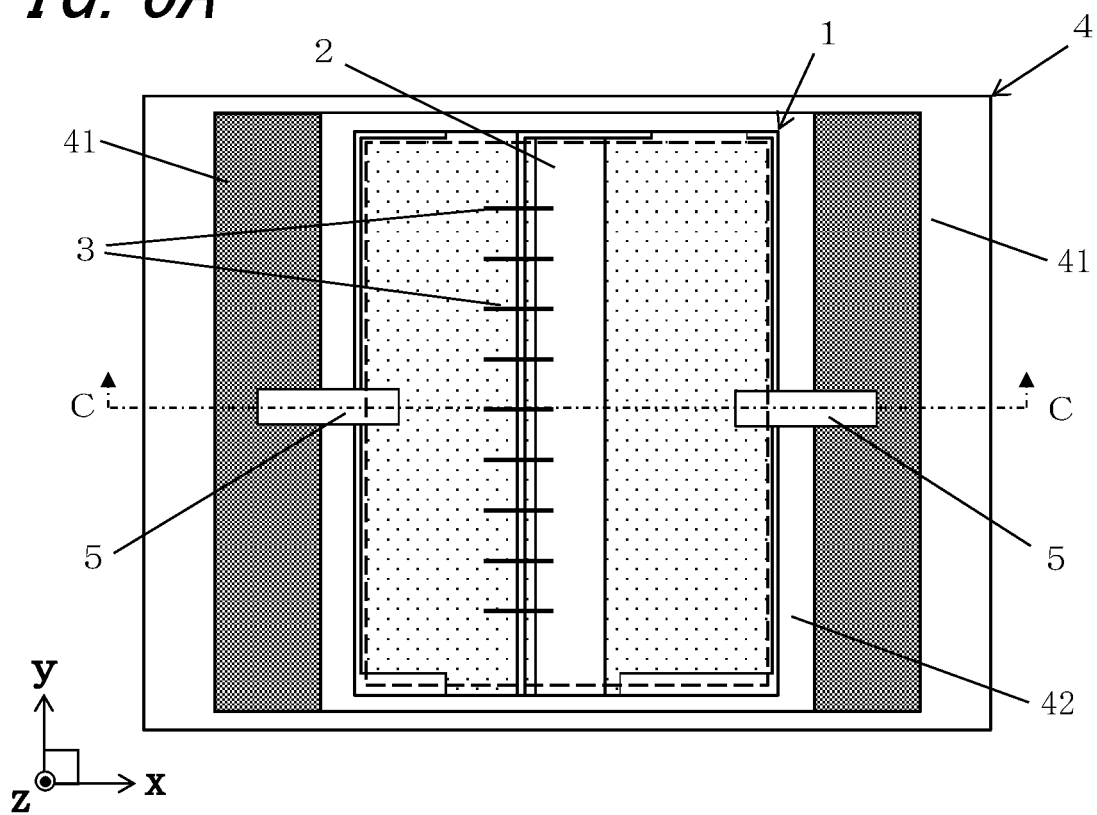
FIG. 6A is a top view illustrating another example of an electronic device using the substrate for mounting the electronic element illustrated in FIGS. 1A and 1B.
Figure 6B:
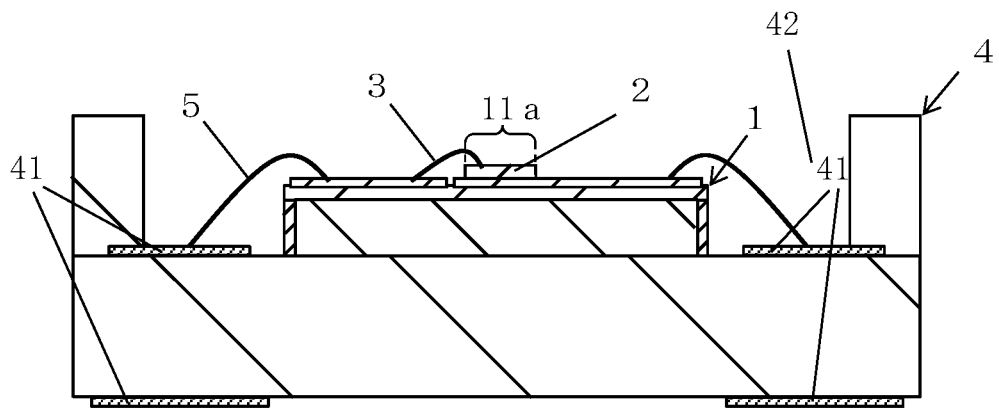
FIG. 6B is a longitudinal sectional view taken along the line C-C in FIG. 6A.

By mounting the electronic element 2 in a rectangular shape on the mounting portion 11a located on the first surface of the substrate for mounting the electronic element 1, as in the example illustrated in FIGS. 4A and 4B, and mounting the substrate for mounting the electronic element 1 on a wiring substrate 4 or a package for housing an electronic element 4, as in the examples illustrated in FIGS. 5A to 6B, the electronic device can be prepared. In the examples illustrated in FIGS. 4A to 6B, the electronic element 2 is mounted such that the longitudinal direction of the electronic element 2 is along the direction (y direction) where the thermal conductivity of the third substrate 13 in the plane direction is small in plan view. The electronic element 2 mounted on the substrate for mounting the electronic element 1 is, for example, a light-emitting element such as a laser diode (LD), or a light-receiving element such as a photo diode (PD). For example, the electronic element 2 is fixed on the mounting portion 11a of one of the metal layers 15 by a bonding material such as Au—Sn, and thereafter the electronic element 2 is mounted on the substrate for mounting the electronic element 1 by electrically connecting an electrode of the electronic element 2 and the other metal layer 15, through the connection member 3 such as a bonding wire. The electrodes of the electronic element 2 and the other metal layer 15 are electrically connected by a plurality of connection members 3 in the examples illustrated in FIGS. 4A to 6B. The wiring substrate 4 or the package for housing the electronic element 4 on which the substrate for mounting the electronic element 1 is mounted can be made of, for example, an insulating substrate such as ceramics, similarly to the first substrate 11, and has a wiring conductor on the surface. The metal layer 15 of the substrate for mounting the electronic element 1 is electrically connected to the wiring substrate 4 or the wiring conductor of the package for housing the electronic element 4.

According to the electronic device of the present embodiment, the substrate for mounting the electronic element 1 having the above configuration, the electronic element 2 mounted on the mounting portion 11a of the substrate for mounting the electronic element 1, and the wiring substrate 4 or the package for housing the electronic element 4 on which the substrate for mounting the electronic element 1 is mounted are included, and therefore an electronic device having good long-term reliability can be obtained.

Figure 7:
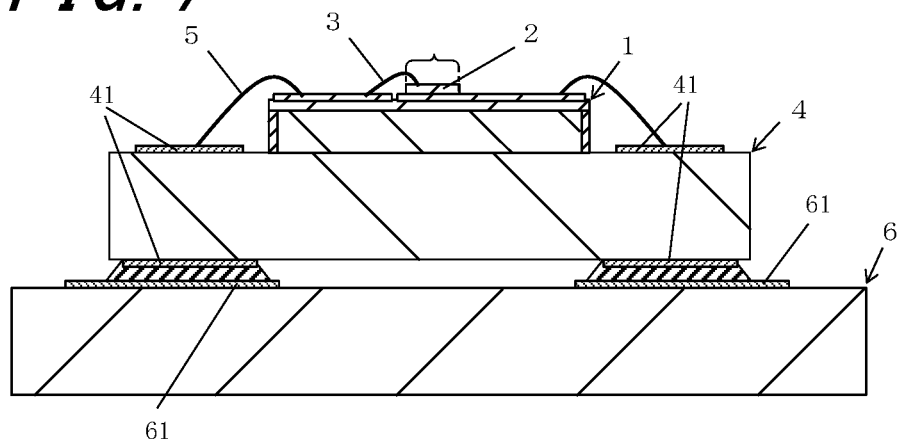
FIG. 7 is a sectional view illustrating a state where the electronic device illustrated in FIGS. 5A and 5B is mounted on a module substrate.
Figure 7:
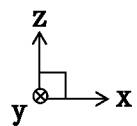

The electronic device of the present embodiment is connected to the wiring conductor and the connection pad 61 of the module substrate 6 through a bonding material 6 such as solder to form an electronic module, as in the example illustrated in FIG. 7. As a result, the electronic element 2 and the connection pad 61 of the module substrate 6 are electrically connected to each other.

According to the electronic module of the present embodiment, the electronic device having the above configuration and the module substrate 6 to which the electronic device is connected are included, and therefore long-term reliability can be improved.

The substrate for mounting the electronic element 1 according to the present embodiment includes a first substrate 11 having a first surface and a second surface opposite to the first surface; a second substrate 12 having a third surface and a fourth surface opposite to the third surface; and a third substrate 13 having a fifth surface and a sixth surface opposite to the fifth surface. The first substrate 11 is made of an insulator, and having a mounting portion 11a for mounting an electronic element 2 at the first surface 11, and the mounting portion 11a for mounting the electronic element 2 is a rectangular shape. The third substrate 13 is made of a carbon material, and the fifth surface is connected to at least the second surface at location overlapped with the mounting portion 11a for mounting the electronic element 2 in plan view. The third substrate 13 has a larger heat conduction in a direction perpendicular to the longitudinal direction of the mounting portion 11a than heat conduction in the longitudinal direction of the mounting portion 11a in plan view. With the above configuration, for example, if the electronic device operates, heat generated from the electronic element 2 is transferred in a different direction with respect to the longitudinal direction of the electronic element 2, and is easily dissipated from the second substrate 12. The expansion of the electronic element 2 due to the heat generated from the electronic element 2, particularly the expansion in the longitudinal direction of the electronic element 2 is reduced, and the periphery of the fifth surface and the side surfaces of the third substrate 13 is held by the first substrate 11 and the second substrate 12. The displacement of the electronic element 2 or the distortion of the substrate for mounting the electronic element 1 is suppressed, and therefore it is possible to easily emit light appropriately.

In particular, If an optical element such as a high-power LD is mounted as the electronic element 2, the substrate for mounting the electronic element 1 for an optical device that can emit light with high accuracy can be obtained.

In a longitudinal sectional view of the mounting portion 11a of the electronic element 2 in the longitudinal direction, if the third substrate 13 has a larger thermal conductivity in the thickness direction than that in the direction perpendicular to the thickness direction, as in the examples illustrated in FIGS. 1A to 6B, heat generated from the electronic element 2 is easily dissipated in the thickness direction than in the longitudinal direction of the mounting portion 11a of the electronic element 2, and the heat transmitted to the second substrate 12 can be reduced. The expansion of the electronic element 2 due to the heat generated from the electronic element 2, particularly the expansion in the longitudinal direction of the electronic element 2 is reduced. The displacement of the electronic element 2 or the distortion of the substrate for mounting the electronic element 1 is suppressed, and therefore it is possible to easily emit light appropriately.

As in the examples illustrated in FIGS. 1A to 6B, if the substrate for mounting the electronic element 1 has a rectangular shape such that the longitudinal direction of the mounting portion 11a for the electronic element 2 is longer in plan view along the electronic element 2 in a rectangular shape, the width of the substrate for mounting the electronic element 1 in a direction perpendicular to the longitudinal direction of the electronic element 2 is reduced, and the heat dissipated in directions different from the longitudinal direction of the electronic element 2 can be easily dissipated to the outside appropriately.

In plan view, the width of the frame portion of the second substrate 12 (distance between the outer edge of the second substrate 12 and the outer edge of the third substrate 13) may be set to 50 µm or more. The outer peripheral portion of the first substrate 11 and the second substrate 12 are appropriately bonded and the first substrate 11 and the third substrate 13 are appropriately bonded inside the second substrate 12, and thus the substrate for mounting the electronic element 1 having good heat dissipation can be obtained.

The substrate for mounting the electronic element 1 according to the present embodiment can be used in a thin, high-power electronic device, and the reliability of the substrate for mounting the electronic element 1 can be improved. For example, if an optical element such as an LD is mounted as the electronic element 2, the substrate for mounting the electronic element 1 according to the present embodiment can be used as the substrate for mounting the electronic element 1 for an optical device that is thin and has good directivity.

If the second substrate 12 is made of metal, for example, if the electronic device operates, heat generated from the electronic element 2 is transferred in a different direction with respect to the longitudinal direction of the electronic element 2, and the heat transmitted to the second substrate 12 is more easily dissipated from the second substrate 12. The expansion of the electronic element 2 due to the heat generated from the electronic element 2, particularly the expansion in the longitudinal direction of the electronic element 2 is reduced, and the periphery of the fifth surface and the side surfaces of the third substrate 13 is held by the first substrate 11 and the second substrate 12. The displacement of the electronic element 2 or the distortion of the substrate for mounting the electronic element 1 is suppressed, and therefore it is possible to easily emit light appropriately.

If the second substrate 12 is an insulator, the first substrate 11 and the second substrate 12 have similar strengths and similar thermal expansion coefficients, and the periphery of the fifth surface and the side surfaces of the third substrate 13 is appropriately held by the first substrate 11 and the second substrate 12 made of the insulator. The displacement of the electronic element 2 or the distortion of the substrate for mounting the electronic element 1 is suppressed, and therefore it is possible to easily emit light appropriately.

If the first substrate 11 and the second substrate 12 are formed of insulators of substantially the same material, a material having the same thermal conductivity $\kappa\alpha$ as the first substrate 11 and the same thermal conductivity $\kappa\beta$ as the second substrate 12 may be used ($\kappa\alpha \approx \kappa\beta$). For example, if the first substrate 11 and the second substrate 12 are made of an aluminum nitride sintered body of substantially the same material, since the first substrate 11 and the second substrate 12 have the same strength and the same thermal expansion coefficient, the periphery of the fifth surface and the side surfaces of the third substrate 13 is appropriately held by the first substrate 11 and the second substrate 12 made of the insulator. The displacement of the electronic element 2 or the distortion of the substrate for mounting the electronic element 1 is suppressed, and therefore it is possible to easily emit light appropriately.

If the thickness T2 of the second substrate 12 and the thickness T3 of the third substrate 13 are the same in size, heat can be appropriately transferred from the entire side surfaces of the third substrate 13 to the second substrate 12, and distortion due to the difference between the thickness of the second substrate 12 and the thickness of the third substrate 13 at the outer edge portion of the first substrate 11 is reduced. The displacement of the electronic element 2 or the distortion of the substrate for mounting the electronic element 1 is suppressed, and therefore it is possible to easily emit light appropriately.

The fact that the thickness T2 of the second substrate 12 and the thickness T3 of the third substrate 13 are the same in size means that the thickness T2 of the second substrate 12 and the thickness T3 of the third substrate 13 are located at a similar thickness within a range of approximately 5% ($0.95T2 \leq T3 \leq 1.05T2$), as described above.

If the second substrate 12 has a frame shape, the outer edge portion of the second surface of the first substrate 11 and the side surfaces of the third substrate 13 are appropriately held, and the heat transfer from the entire side surfaces of the third substrate 13 to the second substrate 12 and the heat transfer from the entire outer edge portion of the first substrate 11 to the second substrate 12 are improved. The displacement of the electronic element 2 or the distortion of the substrate for mounting the electronic element 1 is suppressed, and therefore it is possible to easily emit light appropriately.

The substrate for mounting the electronic element 1 in the first embodiment can be manufactured, for example, by the following manufacturing method.

Figure 8A:
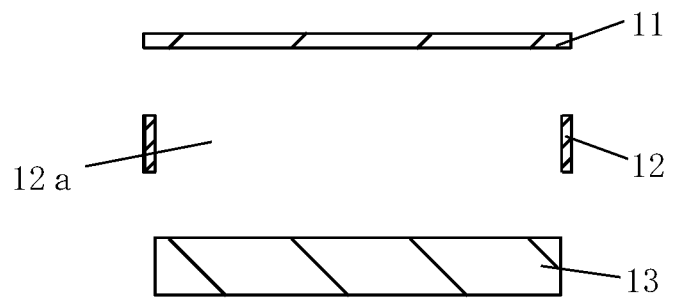
FIGS. 8A to 8D are sectional views illustrating an example of a method of manufacturing the substrate for mounting the electronic element according to the first embodiment.
Figure 8B:
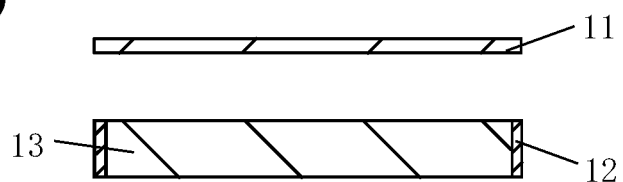
Figure 8C:
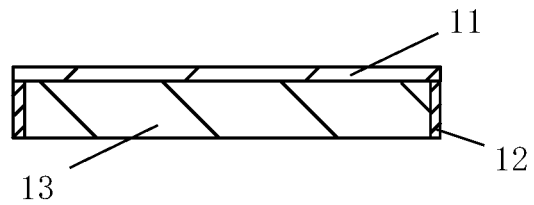
Figure 8D:
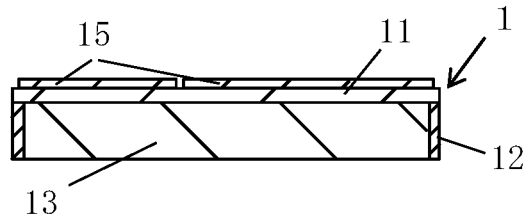
Figure 8D:
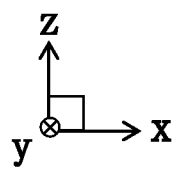

First, as in the example illustrated in FIG. 8A, a first substrate 11, a second substrate 12, and a third substrate 13 are prepared. Next, as in the example illustrated in FIG. 8B, the third substrate 13 is embedded in the through-hole 12a of the second substrate 12. The inner surface of the through-hole 12a of the second substrate 12 and the outer surface of the third substrate 13 are bonded by a bonding material such as an active brazing material made of TiSnAgCu alloy or the like. The first substrate 11 may be formed to have a flatness of 10 µm or less. Next, as in the example illustrated in FIG. 8C, the second surface of the first substrate 11 and the third surface of the second substrate 12, and the second surface of the first substrate 11 and the fifth surface of the third substrate 13 are respectively bonded by a bonding material such as an active brazing material made of TiSnAgCu alloy or the like to form a composite substrate. The thickness of the bonding material is set to approximately 10 µm. Next, the metal layer 15 is formed on the first surface of the first substrate 11. The substrate for mounting the electronic element 1 is formed by disposing and forming the metal layer 15 so that the x direction (thermal conductivity $\lambda x \gg$ thermal conductivity $\lambda y$) of the third substrate 13 in the composite substrate and the longitudinal direction of the mounting portion 11a intersect perpendicularly, as in the example illustrated in FIG. 8D.

The first substrate 11, the second substrate 12, and the third substrate 13 may be simultaneously bonded to each other. For example, the third substrate 13 may be embedded in the through-hole 12 of the second substrate 12 and the first substrate 11 may be bonded to the second substrate 12 and the third substrate 13. In this case, for example, by bonding while applying pressure from the first substrate 11 side and the second substrate 12 side, the first substrate 11, the second substrate 12, and the third substrate 13 are appropriately bonded to each other, and the substrate for mounting the electronic element 1 having good reliability can be obtained.

The thermal conductivity of the substrate for mounting the electronic element 1 of the present embodiment can be measured by, for example, an analysis method such as a laser flash method. If the thermal conductivity of the third substrate 13 is measured, the bonding material for bonding the second substrate 12 and the third substrate 13 is removed, and the third substrate 13 can be measured by the analysis method such as a laser flash method.

(Second Embodiment) Next, a substrate for mounting an electronic element according to a second embodiment will be described with reference to FIGS. 9A to 12D.

An electronic device according to the second embodiment is different from the electronic device according to the above-described embodiment in that a fourth substrate 14 located on the fourth surface of the second substrate 12 and the sixth surface of the third substrate 13, made of an insulator, and having a seventh surface facing the fourth surface and the sixth surface, and an eighth surface opposite to the seventh surface in the thickness direction is provided, in which the fourth substrate 14 is bonded to the fourth surface of the second substrate 12 and the sixth surface of the third substrate 13, that is, the second substrate 12 and the third substrate 13 are located between the first substrate 11 and the fourth substrate 14. A bonding layer 16 is located on the eighth surface of the fourth substrate 14 (lower surface of the substrate for mounting the electronic element 1 in FIGS. 9A to 12D).

Figure 9A:
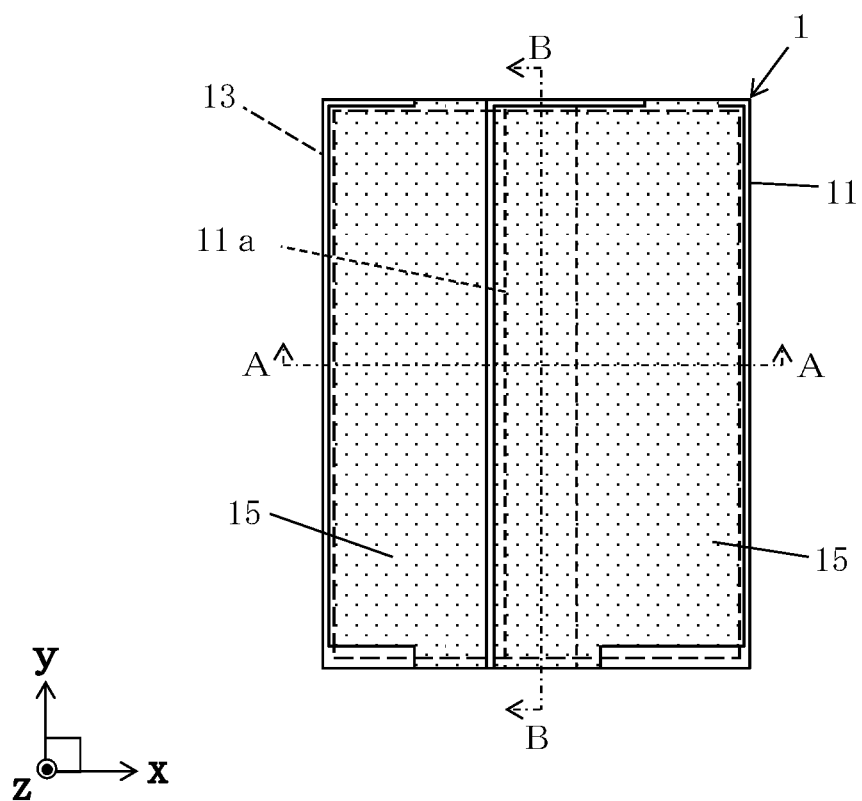
FIG. 9A is a top view illustrating a substrate for mounting an electronic element according to a second embodiment.
Figure 9B:
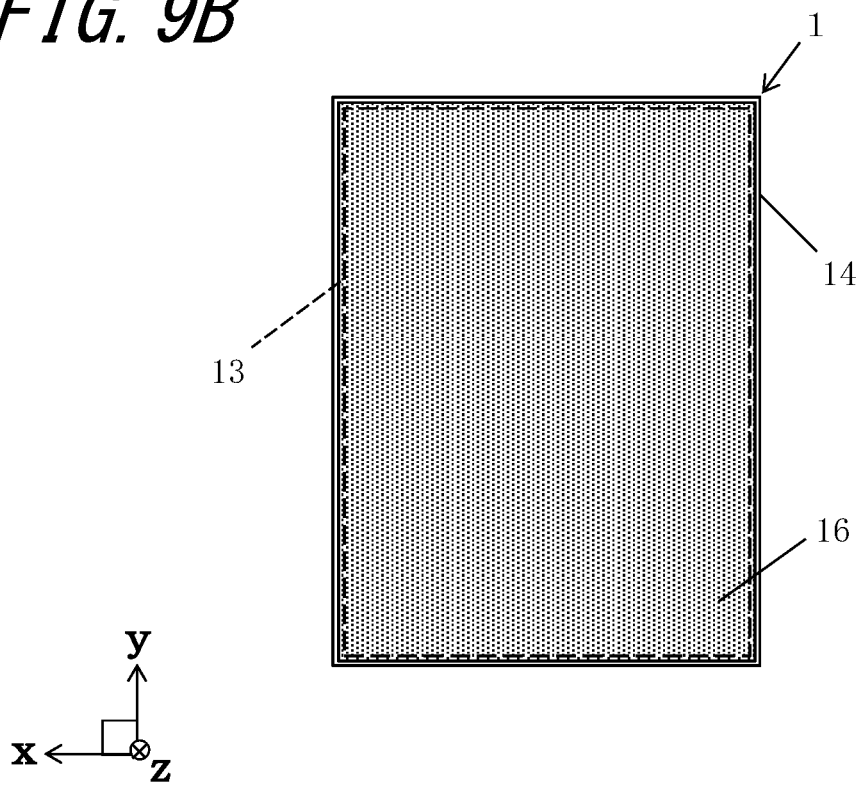
FIG. 9B is a bottom view of FIG. 9A.
Figure 10:
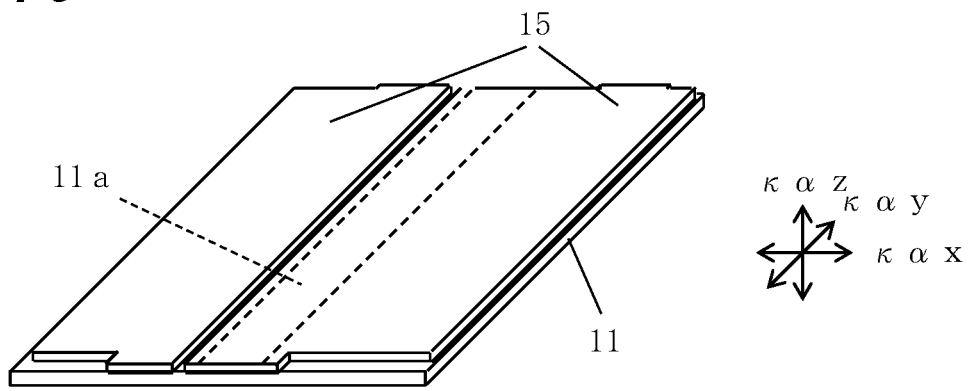
FIG. 10 is an exploded perspective view of a first substrate, a second substrate, and a third substrate of the substrate for mounting the electronic element illustrated in FIGS. 9A and 9B.
Figure 10:
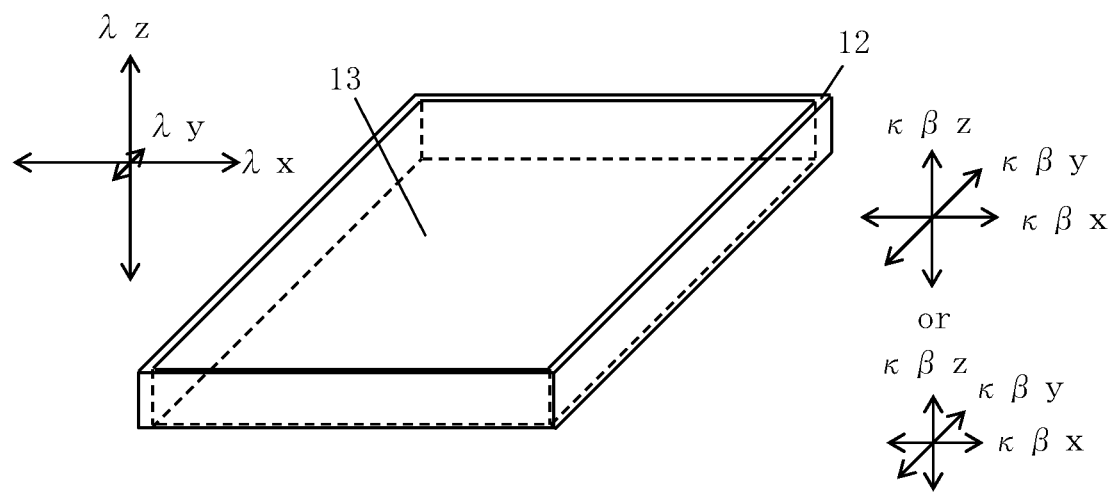
Figure 10:
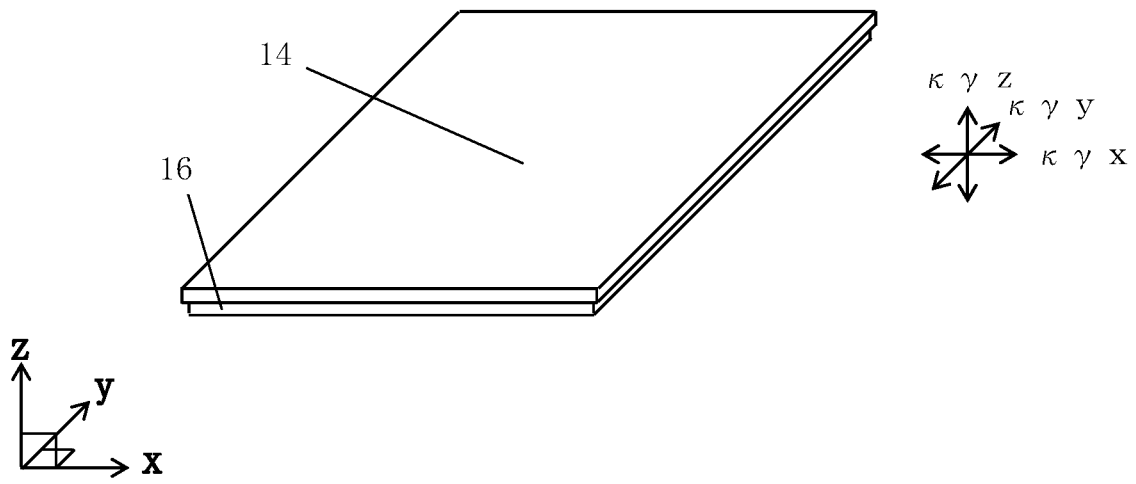
Figure 11A:
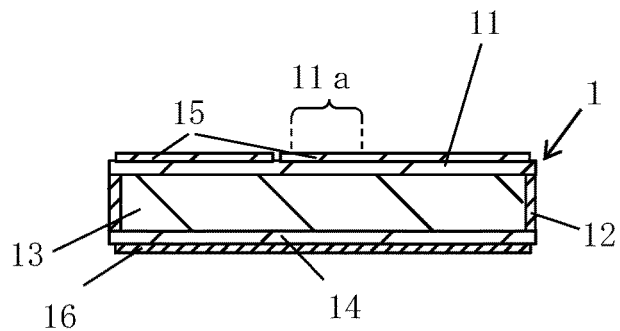
FIG. 11A is a longitudinal sectional view taken along the line A-A of the substrate for mounting the electronic element illustrated in FIG. 9A.
Figure 11A:
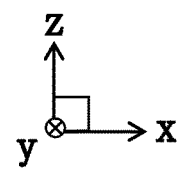
Figure 11B:
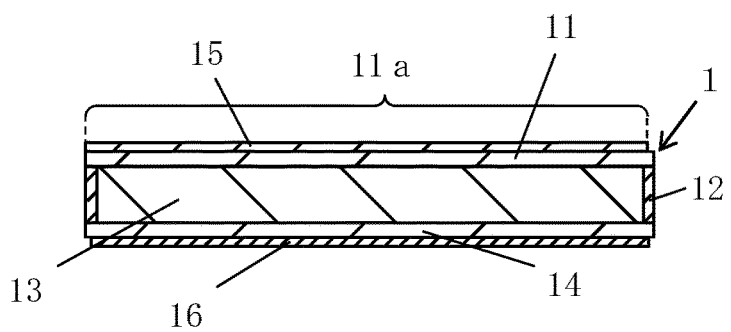
FIG. 11B is a longitudinal sectional view taken along the line B-B of the substrate for mounting the electronic element illustrated in FIG. 6A.
Figure 11B:
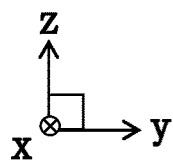

In the example illustrated in FIGS. 9A and 9B, the outer edge of the third substrate 13 is indicated by a broken line in plan view. The metal layer 15 and the bonding layer 16 are indicated by hatching in the example illustrated in FIGS. 9A and 9B.

According to the substrate for mounting the electronic element 1 of the second embodiment, similarly to the substrate for mounting the electronic element 1 of the above embodiment, heat is transferred in a direction different from an expansion direction of the electronic element 2 in the longitudinal direction, and heat is easily dissipated from the second substrate 12, and therefore the expansion of the electronic element 2 in the longitudinal direction is reduced, and the entire six surfaces of the third substrate 13 are held by the first substrate 11, the second substrate 12, and the fourth substrate 14. The displacement of the electronic element 2 or the distortion of the substrate for mounting the electronic element 1 is suppressed, and thus it is possible to easily emit light appropriately.

In the substrate for mounting the electronic element 1 of the second embodiment, the second surface of the first substrate 11, the third surface of the second substrate 12, and the fifth surface of the third substrate 13 are bonded by a bonding material such as an active brazing material made of a TiCuAg alloy, a TiSnAgCu alloy, or the like. The seventh surface of the fourth substrate 14, the fourth surface of the second substrate 12, and the sixth surface of the third substrate 13 are bonded by a bonding material such as an active brazing material made of a TiCuAg alloy, a TiSnAgCu alloy, or the like.

Similarly to the first embodiment, in the substrate for mounting the electronic element 1 of the second embodiment, the first substrate 11 has a square shape in plan view. The second substrate 12 has a square frame shape in plan view. The third substrate 13 has a square shape in plan view. Similarly to the first substrate 11, the fourth substrate 14 has a square shape in plan view. By bonding the first substrate 11, the second substrate 12, the third substrate 13, and the fourth substrate 14, a square composite substrate is formed. In the examples illustrated in FIGS. 9A to 12D, the first substrate 11 and the fourth substrate 14 have a rectangular shape, and a rectangular composite substrate is formed.

The fourth substrate 14 can be manufactured using the same material and method as the first substrate 11 described above. As in the example illustrated in FIG. 10, the thermal conductivity icy of the fourth substrate 11 is substantially constant in the x direction and the y direction in the plane direction, similarly to the first substrate 11, and the thermal conductivity $κγ$ in the z direction in the thickness direction of the fourth substrate 14 is also equivalent to the thermal conductivity $κγ$ in the x direction and the y direction in the plane direction ($κγx≈κγy≈κγz$). For example, if an aluminum nitride sintered body is used as the fourth substrate 14, a substrate having a thermal conductivity $κγ$ of approximately 100 to 200 W/m·K is used as the fourth substrate 14.

Since the second substrate 12 and the third substrate 13 are located between the first substrate 11 and the fourth substrate 14, the distortion of the substrate for mounting the electronic element 1 due to the difference in thermal expansion between the first substrate 11, the second substrate 12, and the third substrate 13 is suppressed. The displacement of the electronic element 2 or the distortion of the substrate for mounting the electronic element 1 is suppressed, and therefore it is possible to easily emit light appropriately.

If the first substrate 11 and the fourth substrate 14 are formed of an insulator of substantially the same material, a material having the same thermal conductivity $κα$ as the first substrate 11 and the thermal conductivity $κγ$ as the fourth substrate 14 may be used ($κα≈κγ$). In particular, if the fourth substrate 14 uses an insulator of substantially the same material as the first substrate 11, that is, for example, uses a 150 W/m·K aluminum nitride sintered body as the first substrate 11, if a 150 W/m·K aluminum nitride sintered body is used as the fourth substrate 14, the distortion of the substrate for mounting the electronic element 1 is more effectively suppressed, and therefore it is possible to easily emit light appropriately.

The thickness of the fourth substrate 11 is, for example, approximately 50 μm to 500 μm, similarly to the substrate thickness T1 of the first substrate 11. If the thickness T1 of the first substrate 11 and the thickness T43 of the fourth substrate 14 are equal to each other within a range of approximately 10% ($0.90T1≤T4≤1.10T1$), the distortion of the substrate for mounting the electronic element 1 is more effectively suppressed, and therefore it is possible to easily emit light appropriately. For example, if the thickness of the first substrate 11 is 100 μm, the thickness of the fourth substrate 14 may be 100 μm (90 μm to 110 μm).

If the first substrate 11 and the fourth substrate 14 are insulators and the second substrate 12 is metal, for example, if the electronic device operates, heat generated from the electronic element 2 and transmitted to the second substrate 12 is further easily dissipated appropriately from the second substrate 12. The expansion of the electronic element 2 due to the heat generated from the electronic element 2, particularly the expansion in the longitudinal direction of the electronic element 2 is reduced, and the periphery of the fifth surface and the side surfaces of the third substrate 13 is held by the first substrate 11 and the second substrate 12. The displacement of the electronic element 2 or the distortion of the substrate for mounting the electronic element 1 is suppressed, and therefore it is possible to easily emit light appropriately.

If the first substrate 11, the second substrate 12, and the fourth substrate 14 are insulators, the first substrate 11, the second substrate 12, and the fourth substrate 14 have similar strengths and thermal expansion coefficients, and the entire six surfaces of the third substrate 13 are appropriately held by the first substrate 11, the second substrate 12, and the fourth substrate 14, which are made of an insulator. The displacement of the electronic element 2 or the distortion of the substrate for mounting the electronic element 1 is suppressed, and therefore it is possible to easily emit light appropriately.

If the first substrate 11, the second substrate 12, and the fourth substrate 14 are formed of insulators of substantially the same material, a material having the thermal conductivity $\kappa\alpha$ as the first substrate 11, the thermal conductivity $\kappa\beta$ as the second substrate 12, and the thermal conductivity $\kappa\gamma$ as the fourth substrate 14, which are the same, may be used ($\kappa\alpha \approx \kappa\beta \approx \kappa\gamma$). For example, if the first substrate 11, the second substrate 12, and the fourth substrate 14 are made of an aluminum nitride sintered body of substantially the same material, since the first substrate 11, the second substrate 12, and the fourth substrate 14 have the same strength and the same thermal expansion coefficient, the entire six surfaces of the third substrate 13 are appropriately held by the first substrate 11, the second substrate 12, and the fourth substrate 14, which are made of an insulator. The displacement of the electronic element 2 or the distortion of the substrate for mounting the electronic element 1 is suppressed, and therefore it is possible to easily emit light appropriately.

If the thickness T2 of the second substrate 12 and the thickness T3 of the third substrate 13 are the same in size, heat can be appropriately transferred from the entire side surfaces of the third substrate 13 to the second substrate 12, and distortion due to the difference between the thickness of the second substrate 12 and the thickness of the third substrate 13 at the outer edge portion of the first substrate 11 and the outer edge portion of the fourth substrate 14 is reduced. The displacement of the electronic element 2, mounting on the wiring substrate 4 or the package for housing the electronic element 4, or the distortion of the substrate for mounting the electronic element 1 is suppressed, and therefore it is possible to easily emit light appropriately.

The fact that the thickness T2 of the second substrate 12 and the thickness T3 of the third substrate 13 are the same in size means that the thickness T2 of the second substrate 12 and the thickness T3 of the third substrate 13 are located at a similar thickness within a range of approximately 5% ($0.95T2 \leq T3 \leq 1.05T2$), similarly to the first embodiment.

In plan view, if the third substrate 13 is located inside the outer edge portion of the first substrate 11 and the outer edge portion of the fourth substrate 14 as in the examples illustrated in FIGS. 9A to 12D, the entire six surfaces of the third substrate 13 are appropriately held by the first substrate 11, the second substrate 12, and the fourth substrate 14, heat transfer from the side surfaces of the third substrate 13 to the second substrate 12, and heat transfer from the sixth surface of the third substrate 13 to the fourth substrate 14 can be improved. The displacement of the electronic element 2 or the distortion of the substrate for mounting the electronic element 1 is suppressed, and therefore it is possible to easily emit light appropriately.

As in the examples illustrated in FIGS. 9A to 12D, the fourth substrate 14 may have the bonding layer 16 positioned on the eighth surface side. The bonding layer 16 located on the fourth substrate 14 can be used, for example, for bonding the substrate for mounting the electronic element 1 and a conductor layer located on the wiring substrate 4 or the package for housing the electronic element 4. The bonding layer 16 can be manufactured by a method similar to the method by which the metal layer 15 described above is formed. By locating the bonding layer 16 on substantially the entire lower surface of the fourth substrate 14, heat dissipation from the substrate for mounting the electronic element 1 to the wiring substrate 4 or the package for housing the electronic element 4 can be improved.

The substrate for mounting the electronic element 1 in the second embodiment can be manufactured, for example, by the following manufacturing method.

Figure 12A:
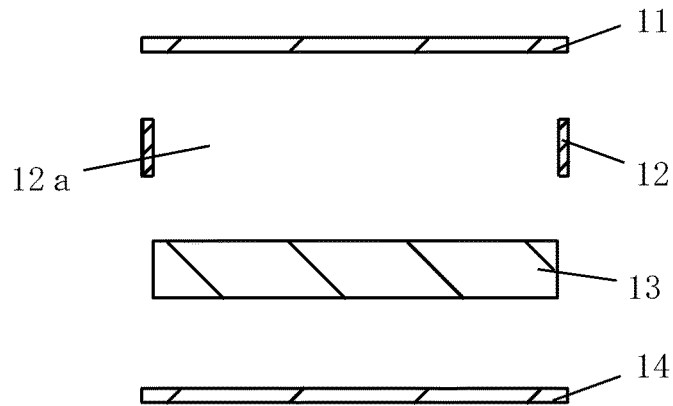
FIGS. 12A to 12D are sectional views illustrating a method of manufacturing the substrate for mounting the electronic element according to the second embodiment.
Figure 12B:
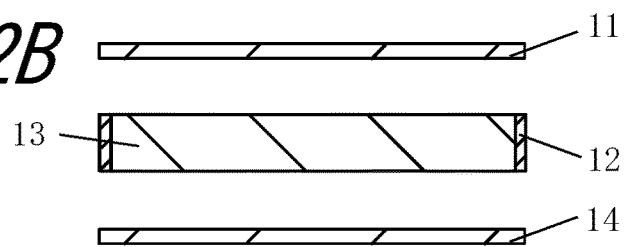
Figure 12C:
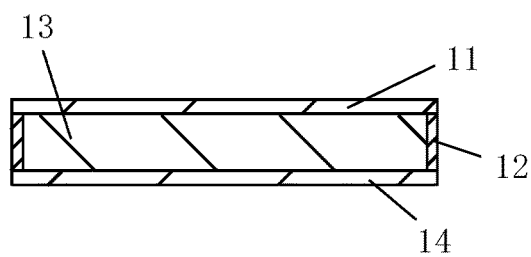
Figure 12D:
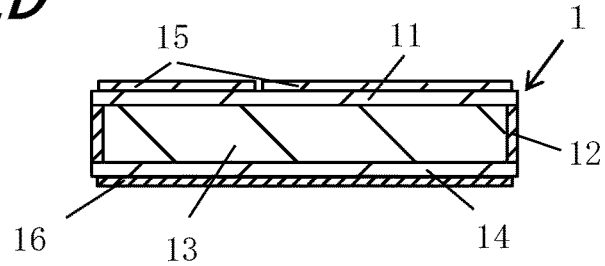
Figure 12D:
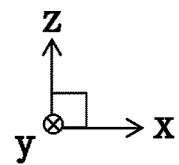

First, as in the example illustrated in FIG. 12A, a first substrate 11, a second substrate 12, a third substrate 13, and a fourth substrate 14 are prepared. Next, as in the example illustrated in FIG. 12B, the third substrate 13 is embedded in the through-hole 12a of the second substrate 12. The inner surface of the through-hole 12a of the second substrate 12 and the outer surface of the third substrate 13 are bonded by a bonding material such as an active brazing material made of TiSnAgCu alloy or the like. The first substrate 11 and the fourth substrate 14 may be formed to have a flatness of 10 μm or less. Next, as in the example illustrated in FIG. 12C, the first substrate 11, the second substrate 12, and the third substrate 13 are bonded to each other, and the fourth substrate 11, the second substrate 12, and the third substrate 13 are bonded to each other, by a bonding material such as an active brazing material made of TiSnAgCu alloy or the like to form a composite substrate. The first substrate 11 and the fourth substrate 14 may be simultaneously bonded to the second substrate 12 and the third substrate 13. The thickness of each bonding material is approximately 10 μm. Next, the metal layer 15 is formed on the first surface of the first substrate 11. The metal layer 15 is disposed and formed so that the x direction (thermal conductivity $\lambda x \gg$ thermal conductivity $\lambda y$) of the second substrate 12 in the composite substrate and the longitudinal direction of the mounting portion 11a intersect perpendicularly. By forming the bonding layer 16 on the eighth surface of the fourth substrate 14, the substrate for mounting the electronic element 1 is formed as in the example illustrated in FIG. 12D.

The third substrate 13 has side surfaces covered by the second substrate 12 and the fifth surface and the sixth surface covered by the first substrate 11 and the fourth substrate 14. Therefore, if forming the thin film layer to be the metal layer 15 on the first surface of the first substrate 11, and forming a plating layer on the thin film layer, or forming the bonding layer 16 on the eighth surface of the fourth substrate 14, since the third substrate 13 is not exposed and the third substrate 13 made of a carbon material is not exposed at the time of manufacturing the substrate for mounting the electronic element 1, deterioration due to chemicals or the like can be reduced. If the electronic device is used, the third substrate 13 is not exposed, and therefore deterioration due to outside air can be suppressed. The width of the frame portion of the second substrate 12 (distance between the outer edge of the second substrate 12 and the outer edge of the third substrate 13) may be set to 50 μm or more in plan view.

The first substrate 11, the second substrate 12, the third substrate 13, and the fourth substrate 14 may be simultaneously bonded to each other. For example, the third substrate 13 may be embedded in the through-hole 12 of the second substrate 12, and the first substrate 11 and the fourth substrate 14 may be bonded to the second substrate 12 and the third substrate 13. In this case, for example, by bonding while applying pressure from the first substrate 11 side and the fourth substrate 14 side, the first substrate 11, the second substrate 12, the third substrate 13, and the fourth substrate 14 are appropriately bonded to each other, and the substrate for mounting the electronic element 1 having good reliability can be obtained. By simultaneously bonding the first substrate 11, the second substrate 12, the third substrate 13, and the fourth substrate 14, it is possible to suppress the exposure of the third substrate 13 at the time of manufacturing and to suppress deterioration due to outside air.

The substrate for mounting the electronic element 1 according to the second embodiment can be manufactured using the same manufacturing method as the method for the substrate for mounting the electronic element 1 according to the above-described embodiment in other respects.

Similarly to the substrate for mounting the electronic element 1 according to the first embodiment, if the substrate for mounting the electronic element 1 of the second embodiment has the rectangular shape along the rectangular electronic element 2 such that the longitudinal direction of the electronic element 2 is longer in plan view, the width of the substrate for mounting the electronic element 1 in a direction perpendicular to the longitudinal direction of the electronic element 2 can be reduced, and heat dissipated in directions different from the longitudinal direction of the electronic element 2 can be easily dissipated to the outside appropriately.

(Third embodiment) Next, an electronic device according to a third embodiment will be described with reference to FIGS. 13A to 16D.

A substrate for mounting an electronic element 1 of the third embodiment is different from the substrate for mounting the electronic element 1 according to the above-described embodiments in that a plurality of third substrates 13 (131, 132, 133) is stacked in the through-hole 12a of the second substrate 12 in the thickness direction of the substrate for mounting the electronic element 1 (z direction in FIGS. 13A to 16D). In the plurality of third substrates 13 (131, 132, 133), the third substrates 13 (131 and 132, 132 and 133) adjacent to each other in the thickness direction are disposed with different thermal conductivity λ in the respective plane directions.

Figure 13A:
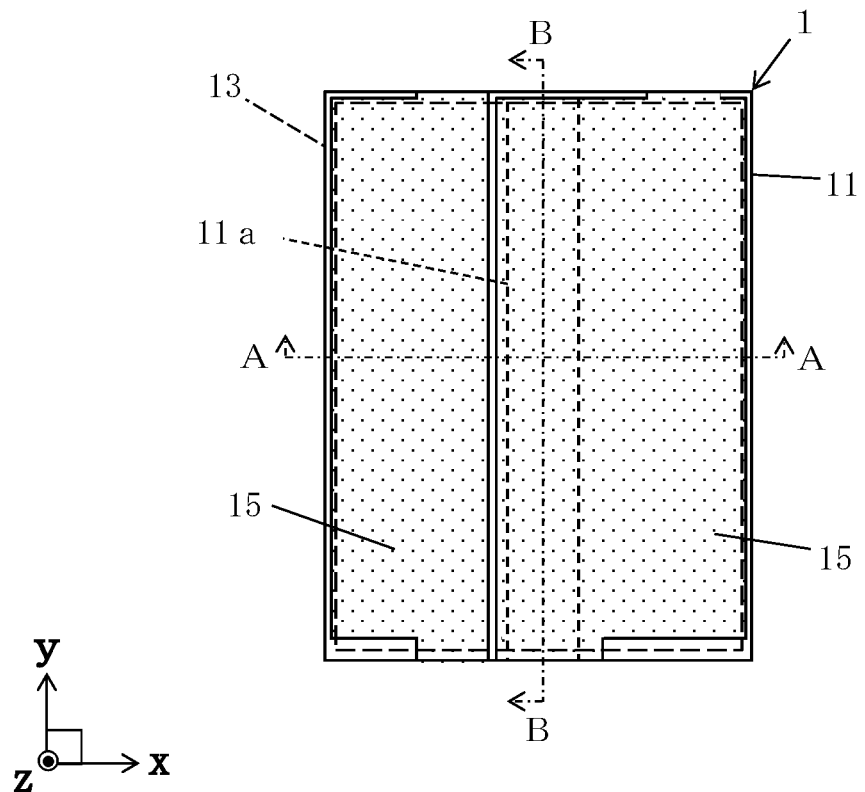
FIG. 13A is a top view illustrating a substrate for mounting an electronic element according to a third embodiment.
Figure 13B:
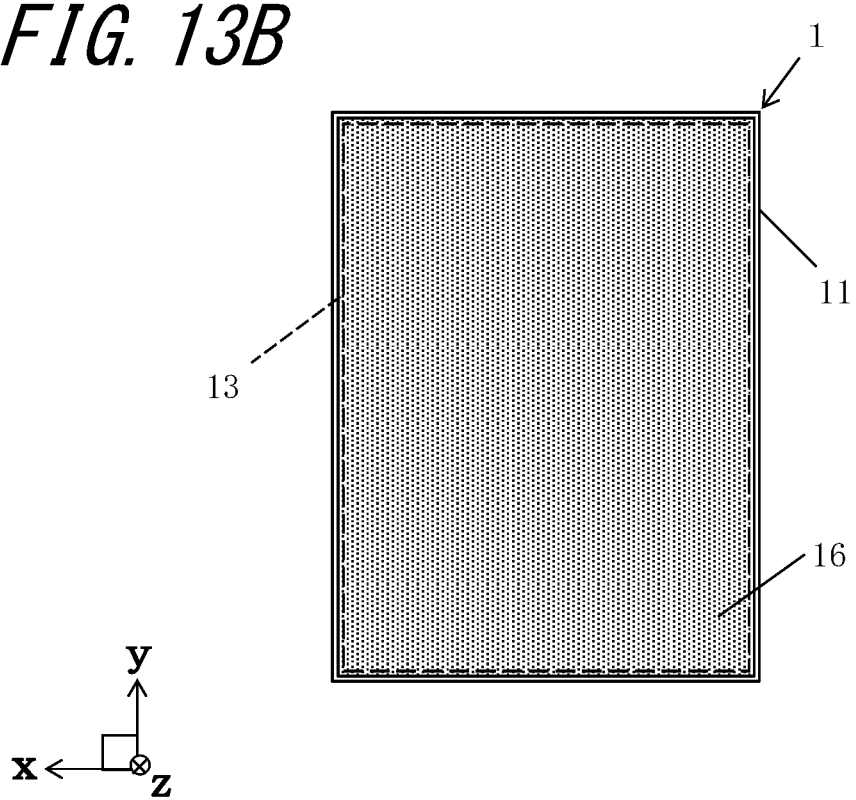
FIG. 13B is a bottom view of FIG. 13A.

In the example illustrated in FIGS. 13A and 13B, the outer edge of the third substrate 13 is indicated by a broken line in plan view. The metal layer 15 and the bonding layer 16 are indicated by hatching in the example illustrated in FIGS. 13A and 13B.

According to the substrate for mounting the electronic element 1 of the third embodiment, similarly to the substrate for mounting the electronic element 1 of the above-described embodiments, heat is transferred in a direction different from the expansion direction of the electronic element 2 in the longitudinal direction, and heat is easily dissipated from the second substrate 12, and thus the expansion of the electronic element 2 in the longitudinal direction is reduced, and the entire six surfaces of the third substrate 13 are held by the first substrate 11, the second substrate 12, and the fourth substrate 14. The displacement of the electronic element 2 or the distortion of the substrate for mounting the electronic element 1 is suppressed, and therefore it is possible to easily emit light appropriately.

Since the plurality of third substrates 13 having different thermal conductivity λ in the plane direction is stacked between the first substrate 11 and the fourth substrate 14, the distortion of the substrate for mounting the electronic element 1 during use is suppressed. The displacement of the electronic element 2 or the distortion of the substrate for mounting the electronic element 1 is suppressed, and therefore it is possible to easily emit light appropriately.

In the substrate for mounting the electronic element 1 of the third embodiment, the second surface of the first substrate 11, the third surface of the second substrate 12, and the fifth surface of the third substrate 131 are bonded by a bonding material such as an active brazing material made of a TiCuAg alloy, a TiSnAgCu alloy, or the like. The seventh surface of the fourth substrate 14, the fourth surface of the second substrate 12, and the sixth surface of the third substrate 133 are bonded by a bonding material such as an active brazing material made of a TiCuAg alloy, a TiSnAgCu alloy, or the like.

Similarly to the substrate for mounting the electronic element 1 of the first embodiment, in the substrate for mounting the electronic element 1 of the third embodiment, the first substrate 11 has a square shape in plan view. The second substrate 12 has a square frame shape in plan view. The third substrate 13 has a square shape in plan view. Similarly to the first substrate 11, the fourth substrate 14 has a square shape in plan view. By bonding the first substrate 11, the second substrate 12, the third substrate 13, and the fourth substrate 14, a square composite substrate is formed. In the examples illustrated in FIGS. 13A to 16D, the first substrate 11 and the fourth substrate 14 have a rectangular shape, and a rectangular composite substrate is formed.

Similarly to the substrate for mounting the electronic element 1 of the above-described embodiments, the substrate thickness T1 of the first substrate 11 and the substrate thickness T4 of the fourth substrate 14 are, for example, approximately 50 μm to 500 μm. Similarly to the substrate for mounting the electronic element 1 of the above-described embodiments, the thickness T2 of the second substrate 12 and the thickness T3 of the third substrate 13 (131, 132, 133) are approximately 100 μm to 2000 μm. The first substrate 11 and the third substrate 13 have T3>T1, and the heat of the first substrate 11 can be appropriately dissipated to the second substrate 12.

If the thickness T2 of the second substrate 12 and the thickness T3 of the third substrate 13 (131, 132, 133) are the same in size, heat can be appropriately transferred from the entire side surfaces of the third substrate 13 to the second substrate 12, and distortion due to the difference between the thickness of the second substrate 12 and the thickness of the third substrate 13 at the outer edge portion of the first substrate 11 is reduced. The displacement of the electronic element 2 or the distortion of the substrate for mounting the electronic element 1 is suppressed, and therefore it is possible to easily emit light appropriately.

The fact that the thickness T2 of the second substrate 12 and the thickness T3 of the third substrate 13 (131, 132, 133) are the same in size means that the thickness T2 of the second substrate 12 and the thickness T3 of the third substrate 13 (131, 132, 133) are located at a similar thickness within a range of approximately 5% ($0.95T2 \leq T3 \leq 1.05T2$).

The thermal conductivity κα of the first substrate 11 and the thermal conductivity κγ of the fourth substrate 14 are substantially constant in the x direction and the y direction in the plane direction of each substrate, similarly to the substrate for mounting the electronic element 1 of the above-described embodiments, and the thermal conductivity κα and the thermal conductivity κγ in the z direction in the thickness direction of the first substrate 11 and the fourth substrate 14 are also equivalent to those in the x direction and the y direction in the plane direction ($\kappa\alpha x \approx \kappa\alpha y \approx \kappa\alpha z$, $\kappa\gamma x \approx \kappa\gamma y \approx \kappa\gamma z$). For example, if an aluminum nitride sintered body is used as the first substrate 11 and the fourth substrate 14, the substrates having a thermal conductivity κ of approximately 100 to 200 W/m·K are used as the first substrate 11 and the fourth substrate 14.

A material having the thermal conductivity κα as the first substrate 11 and the thermal conductivity κγ as the fourth substrate 14, which are the same, (κα≈κγ) may be used, similarly to the substrate for mounting the electronic element 1 of the above-described embodiments.

The thermal conductivity λ of the third substrate 13 (131, 132, 133) differs in magnitude between the x direction and the y direction in the plane direction. The thermal conductivity λ of each of the plurality of second substrates 12 (131, 132, 133) is, for example, as follows, as in the example illustrated in FIG. 14.

Third substrate 131 (upper surface side):
Thermal conductivity $\lambda x1 \approx$ thermal conductivity $\lambda z1 >>$ thermal conductivity $\lambda y1$ Third substrate 132 (intermediate):
Thermal conductivity $\lambda y2 \approx$ Thermal conductivity $\lambda z2 >>$ Thermal conductivity $\lambda x2$ Third substrate 133 (lower surface side):
Thermal conductivity $\lambda x3 \approx$ thermal conductivity $\lambda z3 >>$ thermal conductivity $\lambda y3$ The thermal conductivity λ of the third substrate 131 and the second substrate 133 is the same in the x direction in the plane direction and the z direction in the thickness direction, and is different in the y direction in the plane direction. The thermal conductivity λ of the third substrate 132 is the same in the y direction in the plane direction and the z direction in the thickness direction, and is different in the x direction in the plane direction. For example, the thermal conductivity $\lambda x1$ and the thermal conductivity $\lambda z1$ of the third substrate 131 on the upper surface side are approximately 1000 W/m·K, and the thermal conductivity $\lambda y1$ of the third substrate 131 is approximately 4 W/m·K. The thermal conductivity $\lambda y2$ and the thermal conductivity $\lambda z2$ of the intermediate third substrate 132 are approximately 1000 W/m·K, and the thermal conductivity $\lambda x2$ of the third substrate 132 is approximately 4 W/m·K. The thermal conductivity $\lambda x3$ and the thermal conductivity $\lambda z3$ of the third substrate 133 on the lower surface side are approximately 1000 W/m·K, and the thermal conductivity $\lambda y3$ of the third substrate 133 is approximately 4 W/m·K.

The third surface of the third substrate 131 on the upper surface side is bonded to the second surface of the first substrate 11 such that heat conduction in a direction perpendicular to the longitudinal direction of the mounting portion 11a is larger than heat conduction in the longitudinal direction of the mounting portion 11a disposed on the first surface of first substrate 11.

Figure 14:
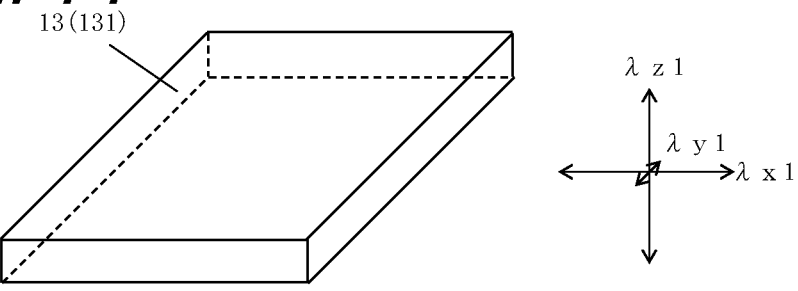
FIG. 14 is an exploded perspective view of a plurality of third substrates of the substrate for mounting the electronic element illustrated in FIGS. 13A and 13B.
Figure 14:
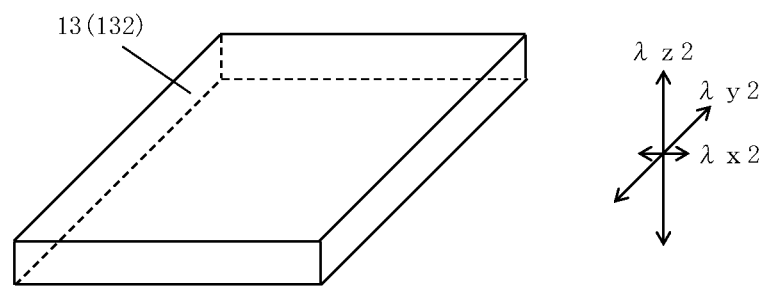
Figure 14:
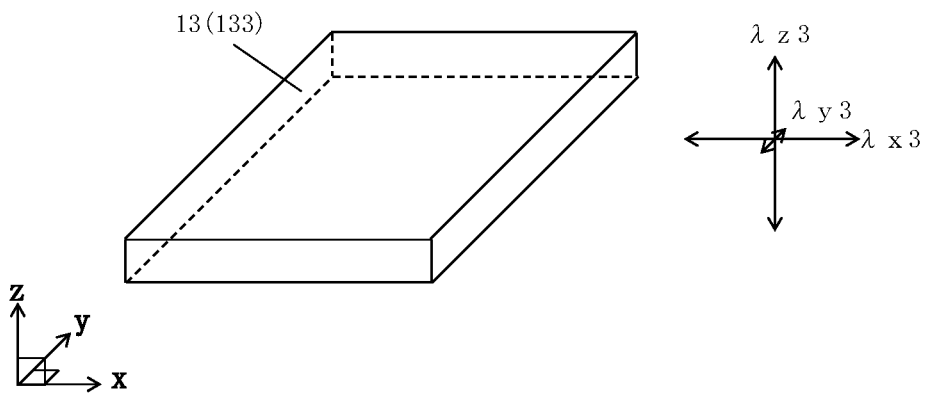
Figure 15A:
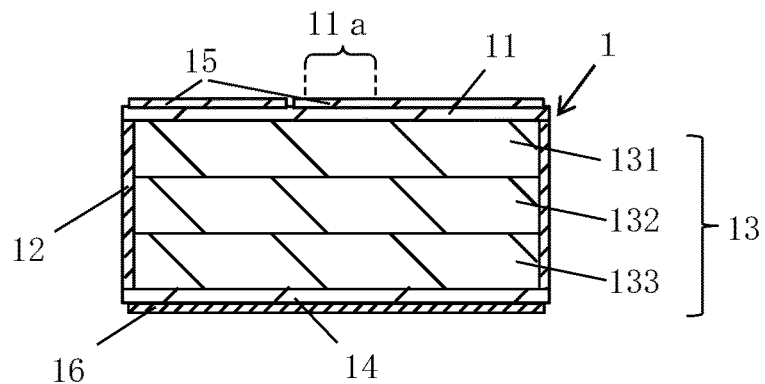
FIG. 15A is a longitudinal sectional view taken along the line A-A of the substrate for mounting the electronic element illustrated in FIG. 13A.
Figure 15A:
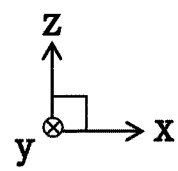
Figure 15B:
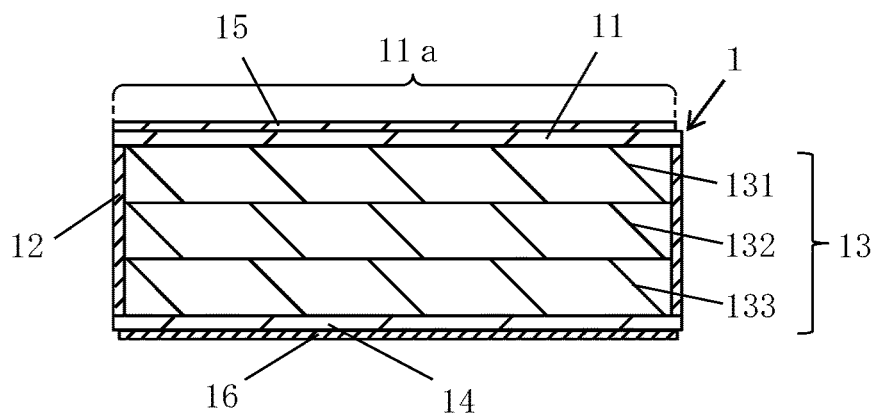
FIG. 15B is a longitudinal sectional view taken along the line B-B of the substrate for mounting the electronic element illustrated in FIG. 13A.
Figure 15B:
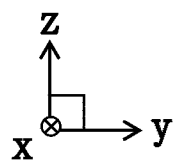

The adjacent third substrates 13 (third substrate 131 and third substrate 132, or third substrate 132 and third substrate 133) are disposed to be rotated at least 90 degrees in plan view as illustrated in FIG. 14, and the directions where the thermal conductivity of the adjacent third substrates 13 (third substrate 131 and third substrate 132, or third substrate 132 and third substrate 133) increase may be perpendicular to each other. As a result, the heat transferred from the third substrate 133 to the fourth substrate 14 is easily dissipated as an entire surface, the heat transferred to the second substrate 12 can be reduced, and the expansion of the electronic element 2 in the longitudinal direction is reduced. The displacement of the electronic element 2 or the distortion of the substrate for mounting the electronic element 1 is suppressed, and therefore it is possible to easily emit light appropriately.

Similarly to the substrate for mounting the electronic element 1 of the above-described embodiments, as the first substrate 11 and the fourth substrate 14 bonded to the third surface of the third substrate 131 and the fourth surface of the third substrate 133, substrates of the same material may be used. For example, if the first substrate 11 is made of an aluminum nitride sintered body having a thermal conductivity of 150 W/m·K, the fourth substrate 14 may be made of an aluminum nitride sintered body having a thermal conductivity of 150 W/m·K. By setting the material of the first substrate 11 bonded to the third surface of the third substrate 131 and the material of the fourth substrate 14 bonded to the fourth surface of the third substrate 133 to be the same as each other, the distortion of the substrate for mounting the electronic element 1 can be appropriately reduced.

Similarly to the substrate for mounting the electronic element 1 of the above-described embodiments, in the first substrate 11 and the fourth substrate 14 respectively bonded to the third surface of the third substrate 131 and the fourth surface of the third substrate 133, the difference between the respective thicknesses may be within 10%, and substrates having the same thickness may be used. For example, if the thickness of the first substrate 11 is 100 μm, the thickness of the fourth substrate 14 may be 100 μm (90 μm to 110 μm). By setting the thickness of the first substrate 11 and the thickness of the fourth substrate 14 bonded to the third surface of the third substrate 131 and the fourth surface of the third substrate 133 to be similar to each other, the distortion of the substrate for mounting the electronic element 1 can be appropriately reduced.

In the plurality of third substrates 13 (131, 132, 133) disposed between the first substrate 11 and the fourth substrate 14, the difference between the respective thicknesses may be within 10%, and substrates having the same thickness may be used. For example, if the thickness of the third substrate 131 on the upper surface side is 1,000 μm, the thickness of the intermediate third substrate 132 may be 1,000 μm (900 μm to 1,100 μm), and the thickness of the third substrate 133 on the lower surface side may be 1,000 μm (900 μm to 1,100 μm). By setting the thicknesses of the plurality of third substrates 13 (131, 132, 133) to be the same each other, the distortion of the substrate for mounting the electronic element 1 can be appropriately reduced.

Similarly to the substrate for mounting the electronic element 1 of the above-described embodiments, if the first substrate 11 and the fourth substrate 14 are insulators and the second substrate 12 is metal, for example, if the electronic device operates, heat generated from the electronic element 2 and transmitted to the second substrate 12 is easily dissipated appropriately from the second substrate 12. The expansion of the electronic element 2 due to the heat generated from the electronic element 2, particularly the expansion in the longitudinal direction of the electronic element 2 is reduced, and the periphery of the fifth surface and the side surfaces of the third substrate 13 is held by the first substrate 11 and the second substrate 12. The displacement of the electronic element 2 or the distortion of the substrate for mounting the electronic element 1 is suppressed, and therefore it is possible to easily emit light appropriately.

Similarly to the substrate for mounting the electronic element 1 of the above-described embodiments, if the first substrate 11, the second substrate 12, and the fourth substrate 14 are insulators, the first substrate 11, the second substrate 12, and the fourth substrate 14 have similar strengths and thermal expansion coefficients, and the entire six surfaces of the third substrate 13 are appropriately held by the first substrate 11, the second substrate 12, and the fourth substrate 14, which are made of an insulator. The displacement of the electronic element 2 or the distortion of the substrate for mounting the electronic element 1 is suppressed, and therefore it is possible to easily emit light appropriately.

If the first substrate 11, the second substrate 12, and the fourth substrate 14 are formed of the insulator of substantially the same material, similarly to the substrate for mounting the electronic element 1 of the above-described embodiments, for example, if the first substrate 11, the second substrate 12, and the fourth substrate 14 are made of the aluminum nitride sintered body of substantially the same material, since the first substrate 11, the second substrate 12, and the fourth substrate 14 have the same strength and the same thermal expansion coefficient, the six entire surfaces of the third substrate 13 can be appropriately held by the first substrate 11, the second substrate 12, and the fourth substrate 14 made of the insulator. The displacement of the electronic element 2 or the distortion of the substrate for mounting the electronic element 1 is suppressed, and therefore it is possible to easily emit light appropriately.

As in the examples illustrated in FIGS. 13A, 13B, 15A, 15B, and 16A to 16D, the bonding layer 16 may be located on the lower surface side of the fourth substrate 14. The bonding layer 16 located on the fourth substrate 14 can be used, for example, for bonding the substrate for mounting the electronic element 1 and a conductor layer located on the wiring substrate 4 or the package for housing the electronic element 4. The bonding layer 16 can be manufactured by a method similar to the method for the metal layer 15 described above. The heat dissipation from the substrate for mounting the electronic element 1 to the wiring substrate 4 or the package for housing the electronic element 4 can be improved by positioning the bonding layer 16 on substantially the entire lower surface of the fourth substrate 14.

The substrate for mounting the electronic element 1 in the third embodiment can be manufactured, for example, by the following manufacturing method.

Figure 16A:
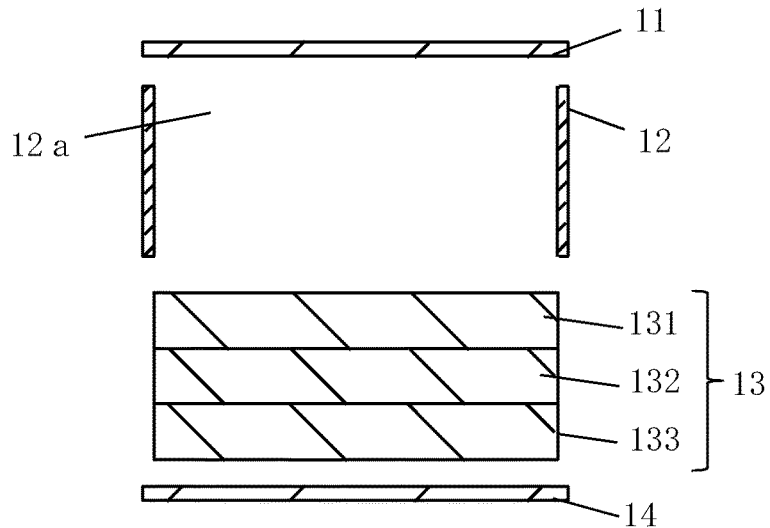
FIGS. 16A to 16D are sectional views illustrating a method of manufacturing the substrate for mounting the electronic element according to the third embodiment.
Figure 16B:
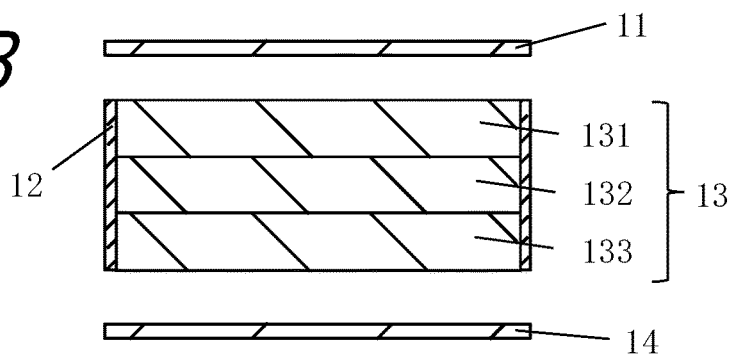
Figure 16C:
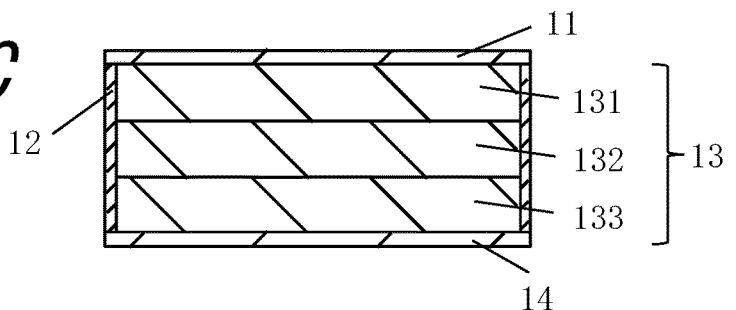
Figure 16D:
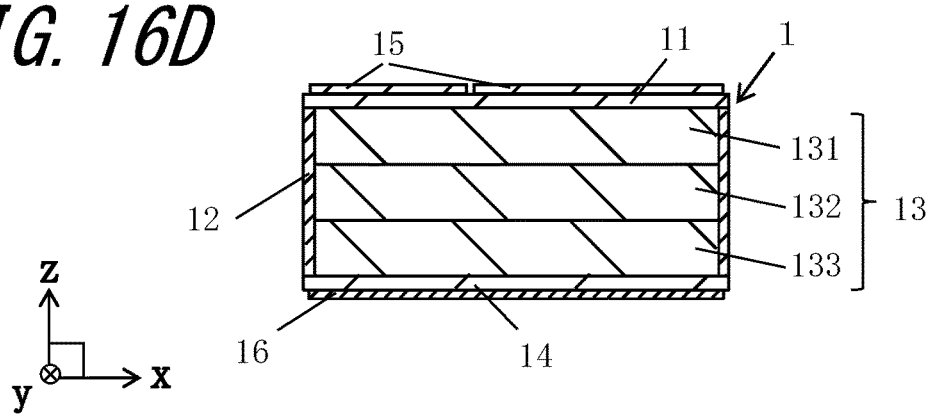

First, as illustrated in FIG. 16A, a first substrate 11, a second substrate 12, third substrates 13 (131, 132, 133) made of a plurality of sheets, and a fourth substrate 14 are prepared. The third substrates 13 made of the plurality of sheets are disposed such that adjacent third substrates 13 have different thermal conductivity λ in the respective plane directions. Next, as in the example illustrated in FIG. 16B, the third substrates 13 (131, 132, 133) are embedded in the through-hole 12a of the second substrate 12. The inner surface of the through-hole 12a of the second substrate 12 and the outer surface of the third substrates 13 (131, 132, 133) are bonded by a bonding material such as an active brazing material made of TiSnAgCu alloy or the like. The first substrate 11 and the fourth substrate 14 may be formed to have a flatness of 10 μm or less. Next, as in the example illustrated in FIG. 16C, the first substrate 11, the second substrate 12, and the third substrate 13 (131) are bonded to each other, and the fourth substrate 14, the second substrate 12, and the third substrate 13 (133) are bonded to each other, by a bonding material such as an active brazing material made of a TiSnAgCu alloy or the like. The first substrate 11, the second substrate 12, and the third substrates 13 (131, 132, 133) may be simultaneously bonded if the fourth substrate 14, the second substrate 12, and the third substrates 13 (131, 132, 133) are bonded. The thickness of the bonding material is set to approximately 10 μm. Next, the metal layer 15 is formed on the first surface of the first substrate 11. The metal layer 15 is disposed and formed so that the x direction (thermal conductivity λx>> thermal conductivity λy) of the second substrate 121 in the composite substrate and the longitudinal direction of the mounting portion 11a intersect perpendicularly. By forming the bonding layer 16 on the eighth surface of the fourth substrate 14, the substrate for mounting the electronic element 1 is formed as in the example illustrated in FIG. 16D.

For example, the substrate for mounting the electronic element 1 having a total thickness of 3.3 mm and 10 mm SQ was prepared using an aluminum nitride sintered body having a thickness of 0.15 mm and a thermal conductivity of 170 W/m·K as the first substrate 11 and the fourth substrate 14, using a copper substrate having a thickness of 3 mm as the second substrate 12, and using a structure in which graphene each having a thickness of 1 mm is stacked as the third substrate 13 (131, 132, 133). If the thermal conductivity of the substrate for mounting the electronic element 1 was measured by the laser flash method described above, the thermal conductivity of the substrate for mounting the electronic element 1 in the third embodiment was 650 W/m·K.

The third substrate 13 (131, 132, 133) has side surfaces covered by the second substrate 12 and the fifth surface and the sixth surface covered by the first substrate 11 and the fourth substrate 14. Therefore, if forming the thin film layer to be the metal layer 15 on the first surface of the first substrate 11, and forming a plating layer on the thin film layer metal layer 15, or forming the bonding layer on the eighth surface of the fourth substrate 14, since the third substrate 13 (131, 132, 133) is not exposed and the third substrate 13 (131, 132, 133) made of a carbon material is not exposed at the time of manufacturing the substrate for mounting the electronic element 1, deterioration due to chemicals or the like can be reduced. If the electronic device is used, the third substrate 13 is not exposed, and therefore deterioration due to outside air can be suppressed. The width of the frame portion of the second substrate 12 (distance between the outer edge of the second substrate 12 and the outer edge of the third substrate 13 (131, 132, 133)) may be set to 50 μm or more in plan view.

The first substrate 11, the second substrate 12, the third substrate 13 (131, 132, 133), and the fourth substrate 14 may be simultaneously bonded to each other. For example, the third substrate 13 (131, 132, 133) may be embedded in the through-hole 12 of the second substrate 12, and the first substrate 11 and the fourth substrate 14 may be bonded to the second substrate 12 and the third substrate 13 (131, 132, 133). In this case, for example, by bonding while applying pressure from the first substrate 11 side and the fourth substrate 14 side, the first substrate 11, the second substrate 12, the third substrate 13 (131, 132, 133), and the fourth substrate 14 are appropriately bonded to each other, and the substrate for mounting the electronic element 1 having good reliability can be obtained. By simultaneously bonding the first substrate 11, the second substrate 12, the third substrate 13 (131, 132, 133), and the fourth substrate 14, it is possible to suppress the exposure of the third substrate 13 (131, 132, 133) at the time of manufacturing and to suppress deterioration due to outside air.

The substrate for mounting the electronic element 1 according to the third embodiment can be manufactured using the same manufacturing method as the method for the substrate for mounting the electronic element 1 according to the above-described embodiments in other respects.

Similarly to the substrate for mounting the electronic element 1 according to the first embodiment, if the substrate for mounting the electronic element 1 of the third embodiment has the rectangular shape along the rectangular electronic element 2 such that the longitudinal direction of the electronic element 2 is longer in plan view, the width of the substrate for mounting the electronic element 1 in a direction perpendicular to the longitudinal direction of the electronic element 2 can be reduced, and heat dissipated in directions different from the longitudinal direction of the electronic element 2 can be easily dissipated to the outside appropriately.

The metal layer 15 on the first surface of the first substrate 11 is formed by the thin film method in the above-described example, and may be a metal layer using a known co-fire method or post-fire method in the related art. If such a metal layer 15 is used, the metal layer 15 is previously disposed on the first surface of the first substrate 11 before bonding the first substrate 11 to the second substrate 12. In order to improve the flatness of the first substrate 11, as described in the first embodiment, the metal layer 15 on the first surface of the first substrate 11 may be formed by a thin film method.

(Fourth embodiment) Next, an electronic device according to a fourth embodiment will be described with reference to FIGS. 17A to 18B.

A substrate for mounting an electronic element 1 according to the fourth embodiment is different from the substrate for mounting the electronic element 1 according to the above-described embodiments in that the width of the frame portion of the second substrate 12 differs in the longitudinal direction of the mounting portion 11a of the electronic element 2 and in a direction perpendicular to the longitudinal direction, in plan view.

Figure 17A:
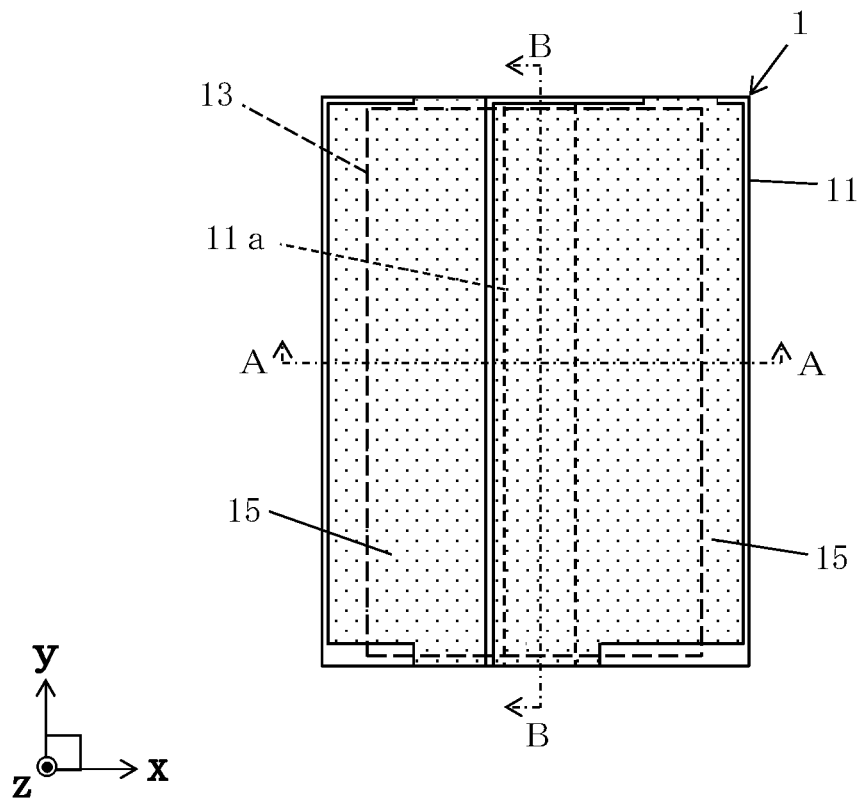
FIG. 17A is a top view illustrating a substrate for mounting an electronic element according to a fourth embodiment.
Figure 17B:
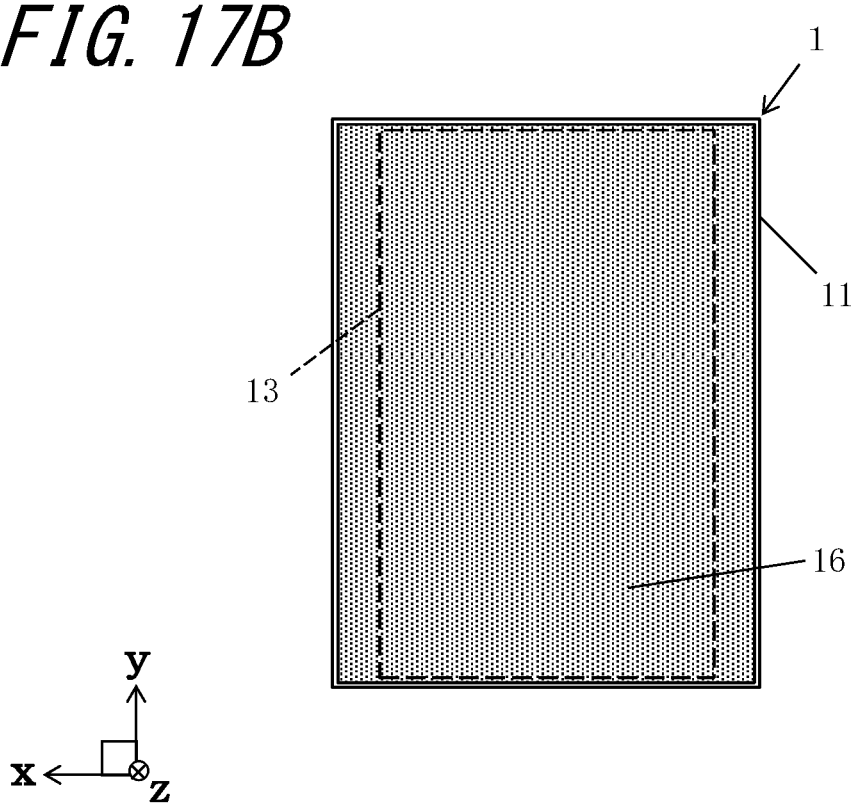
FIG. 17B is a bottom view of FIG. 17A.
Figure 18A:
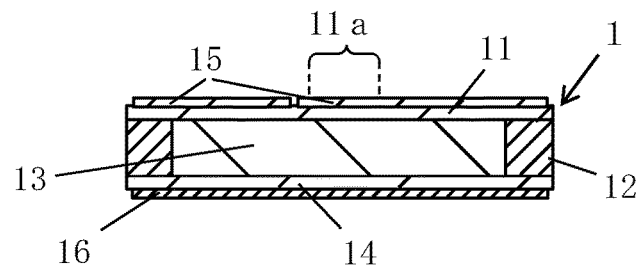
FIG. 18A is a longitudinal sectional view taken along the line A-A of the substrate for mounting the electronic element illustrated in FIG. 17A.
Figure 18A:
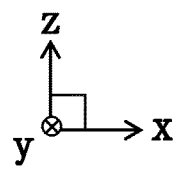
Figure 18B:
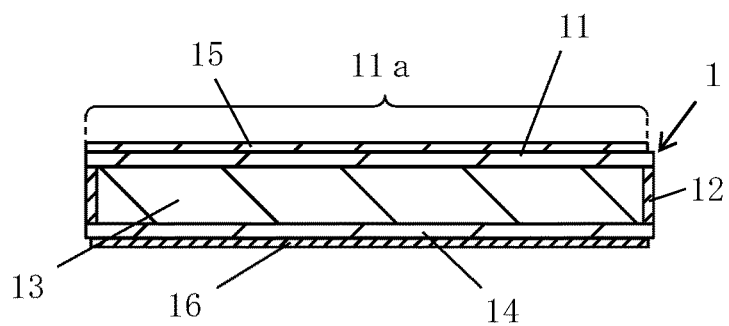
FIG. 18B is a longitudinal sectional view taken along the line B-B of the substrate for mounting the electronic element illustrated in FIG. 17A.
Figure 18B:
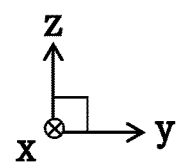

In the example illustrated in FIGS. 17A and 17B, the outer edge of the third substrate 13 is indicated by a broken line in plan view. The metal layer 15 and the bonding layer 15 are indicated by hatching in the example illustrated in FIGS. 17A and 17B.

According to the substrate for mounting the electronic element 1 of the fourth embodiment, similarly to the substrate for mounting the electronic element 1 of the above-described embodiments, heat is transferred in a direction different from the expansion direction of the electronic element 2 in the longitudinal direction, and heat is easily dissipated from the second substrate 12, and thus the expansion of the electronic element 2 in the longitudinal direction is reduced, and the entire six surfaces of the third substrate 13 are held by the first substrate 11, the second substrate 12, and the fourth substrate 14. The displacement of the electronic element 2 or the distortion of the substrate for mounting the electronic element 1 is suppressed, and therefore it is possible to easily emit light appropriately. The width of the frame portion of the second substrate 12 is increased in a direction perpendicular to the longitudinal direction of the mounting portion 11a of the electronic element 2, the heat can be transferred in a direction different from the longitudinal expansion direction of the electronic element 2, and the heat can be more easily dissipated from the second substrate 12.

If the bonding area between the first substrate 11 and the second substrate 12 and the bonding area between the fourth substrate 14 and the second substrate 12 in the direction perpendicular to the longitudinal direction of the electronic element 2 are increased, the bonding between the first substrate 11 and the second substrate 12 and the bonding between the fourth substrate 14 and the second substrate 12 are improved. The distortion of the substrate for mounting the electronic element 1 in a direction perpendicular to the longitudinal direction of the electronic element 2 where the heat of the electronic element 2 is easily transferred is suppressed, and therefore it is possible to easily emit light appropriately.

The width of the third substrate 13 in a direction perpendicular to the longitudinal direction of the electronic element 2 is at least wider than the width of the electronic element 2, in plan view. If the width of the third substrate 13 in the direction perpendicular to the longitudinal direction of the electronic element 2 is at least twice or more the width of the electronic element 2 and the thickness of the third substrate 11 or more, the heat transfer from the third substrate 13 to the fourth substrate 14 side suppresses the heat transfer to the second substrate 12 side. Therefore, the distortion of the substrate for mounting the electronic element 1 is suppressed, and it is possible to easily emit light appropriately.

In the substrate for mounting the electronic element 1 of the fourth embodiment, the width of the frame portion on the small side of the second substrate 12 (distance between the outer edge of the second substrate 12 and the outer edge of the third substrate 13) may be set to 50 μm or more in plan view. The outer peripheral portion of the first substrate 11 and the second substrate 12 are appropriately bonded and the first substrate 11 and the third substrate 13 are appropriately bonded inside the second substrate 12, and therefore the substrate for mounting the electronic element 1 having good heat dissipation can be obtained.

If the thickness T2 of the second substrate 12 and the thickness T3 of the third substrate 13 are the same in size, heat can be appropriately transferred from the entire side surfaces of the third substrate 13 to the second substrate 12, and distortion due to the difference between the thickness of the second substrate 12 and the thickness of the third substrate 13 at the outer edge portion of the first substrate 11 is reduced. The displacement of the electronic element 2 or the distortion of the substrate for mounting the electronic element 1 is suppressed, and therefore it is possible to easily emit light appropriately.

The fact that the thickness T2 of the second substrate 12 and the thickness T3 of the third substrate 13 are the same in size means that the thickness T2 of the second substrate 12 and the thickness T3 of the third substrate 13 are located at a similar thickness within a range of approximately 5% ($0.95T2 \leq T3 \leq 1.05T2$), as described above.

A material having the thermal conductivity $\kappa\alpha$ as the first substrate 11 and the thermal conductivity $\kappa\gamma$ as the fourth substrate 14, which are the same, may be used, similarly to the substrate for mounting the electronic element 1 of the first embodiment and the substrate for mounting the electronic element 1 of the second embodiment ($\kappa\alpha \approx \kappa\gamma$).

The substrate for mounting the electronic element 1 according to the fourth embodiment can be manufactured using the same manufacturing method as the method for the substrate for mounting the electronic element 1 according to the above-described embodiments in other respects.

The present disclosure is not limited to the examples of the above-described embodiments, and various modifications are possible. For example, the composite substrate to which the first substrate 11, the second substrate 12, the third substrate 13, and the fourth substrate 14 are bonded may have a square shape having a notch portion or a chamfer portion at a corner.

Similarly to the substrate for mounting the electronic element 1 of the third embodiment, in the substrate for mounting the electronic element 1 of the fourth embodiment, the third substrates 13 may have a plurality of third substrates 13 (131, 132, 133) stacked in the thickness direction of the substrate for mounting the electronic element 1.

The invention claimed is:

1. A substrate comprising:
a first member; and
a second member covered by the first member, wherein
the second member includes a first plate material and a second plate material each of which is a plate-like member comprising a carbon material,
the first plate material and the second plate material are bonded to each other in a state of being laminated in a first direction which is a thickness direction of the second member,
the second member has a first bonding portion between the first plate material and the second plate material on a side surface extending along the first direction,
the second member further includes a third plate material which is bonded to the second plate material in a state of being laminated from a side opposite to the first plate material, and a second bonding portion between the second plate material and the third plate material,
the first member covers the first bonding portion not to be exposed to an outside and covers the second bonding portion not to be exposed to the outside,
one direction intersecting the first direction is a second direction, and another direction intersecting the first direction and the second direction is a third direction,
in the first direction,
thermal conductivities of both the first plate material and the second plate material are greater than a thermal conductivity of the first member, and
a thermal conductivity of the third plate material is greater than the thermal conductivity of the first member,
the thermal conductivity of the first plate material in the first direction is greater than a thermal conductivity of the first plate material in the second direction,
the thermal conductivity of the second plate material in the first direction is greater than a thermal conductivity of the second plate material in the third direction,
a thermal conductivity of the third plate material in the first direction is greater than a thermal conductivity of the third plate material in the second direction,
in the second direction,
the thermal conductivities of the first plate material and the third plate material are smaller than the thermal conductivity of the first member, and
the thermal conductivity of the second plate material is greater than the thermal conductivity of the first member, and
in the third direction:
thermal conductivities of the first plate material and the third plate material are greater than a thermal conductivity of the first member, and
the thermal conductivity of the second plate material is smaller than the thermal conductivity of the first member.

2. The substrate according to claim 1, wherein
a first joining surface between the first plate material and the second plate material and a second joining surface between the second plate material and the third plate material extend along the second direction and the third direction.

3. The substrate according to claim 1, wherein
the first member continuously exists from one end to another end of the second member in the first direction.

4. The substrate according to claim 1, wherein
the first member further includes a protection portion having a two-layer structure that covers a pair of surfaces of the second member intersecting the first direction.

* * * * *